United States Patent
Hara et al.

(10) Patent No.: US 8,580,374 B2
(45) Date of Patent: *Nov. 12, 2013

(54) RESIN MOLDED BODY

(75) Inventors: Shigeo Hara, Hamamatsu (JP);
Takahiko Yamanaka, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/534,473

(22) Filed: Jun. 27, 2012

(65) Prior Publication Data

US 2013/0004722 A1  Jan. 3, 2013

(30) Foreign Application Priority Data

Jun. 30, 2011 (JP) ................. P2011-145586

(51) Int. Cl.
*B32B 3/00* (2006.01)
*B32B 3/26* (2006.01)
*C08F 287/00* (2006.01)

(52) U.S. Cl.
USPC ............. 428/161; 428/54; 428/162; 428/221; 428/213; 428/320.2; 428/333; 428/339; 428/542.2; 356/256; 356/402; 356/445; 356/601; 356/630

(58) Field of Classification Search
USPC .......... 428/44, 54, 161, 221, 320.2, 333, 339, 428/542.2; 356/402, 445, 601, 630
See application file for complete search history.

(56) References Cited

FOREIGN PATENT DOCUMENTS

| JP | 2005-153192 | 6/2005 |
|---|---|---|
| JP | 2007-225935 | 9/2007 |
| JP | 4427026 | 3/2010 |
| WO | 2008/047514 | 4/2008 |

OTHER PUBLICATIONS

U.S. Office Action dated Oct. 3, 2012 that issued in U.S. Appl. No. 13/534,451 including Double Patenting Rejection on pp. 2-3.
Winey et al., "Morphology of a Lamellar Diblock Copolymer Aligned Perpendicular to the Sample Plane: Transmission Electron Microscopy and Small-Angle X-ray Scattering," Macromolecules, vol. 26, No. 16, Apr. 27, 1993, pp. 4373-4375.
Vigild, et al., "Influence of Shear on the Alignment of a Lamellae-Forming Pentblock Copolymer," Macromolecules, vol. 34, No. 4, Jan. 20, 2001, pp. 951-964.
Office Action dated Dec. 19, 2012 in U.S. Appl. No. 13/534,523 including Double Patenting Rejections at pp. 2-4.

(Continued)

*Primary Examiner* — Maria Veronica Ewald
*Assistant Examiner* — Joanna Pleszczynska
(74) *Attorney, Agent, or Firm* — Drinker Biddle & Reath LLP

(57) ABSTRACT

A resin molded body comprises a front surface layer disposed on a front surface side, a back surface layer disposed on a back surface side, and an intermediate layer disposed between the front surface layer and the back surface layer, each of the layers has a micro-phase separated structure including lamellar micro domains, each of the micro domains of the layers has a wave-like shape having amplitudes in the opposite direction of the front surface and the back surface, a maximum value of predetermined distances in the micro domains of the front surface layer and a maximum value of predetermined distances in the micro domains of the back surface layer are larger than the wavelength in the visible light range, and predetermined distances in the micro domains of the intermediate layer are equal to or less than the wavelength in the visible light range.

12 Claims, 13 Drawing Sheets

(56) References Cited

OTHER PUBLICATIONS

Shinya Yoshioka, "Comparative physiological biochemistry," 2008, pp. 86-95, vol. 25, No. 3, including partial English translation.

Yoshiaki Takahashi et al., "Comparison between Flow-Induced Alignment Behaviors of Poly(styrene-*block*-2-vinylpyridine)s and Poly(styrene-*block*-isoprene)s Solutions near ODT," Polymer Journal, 2005, pp. 900-905, vol. 37, No. 12.

H. Wang et al., "Ordering Kinetics and Alignment of Block Copolymer Lamellae under Shear Flow," Macromolecules, 1999, pp. 3695-3711, vol. 32.

Ian W. Hamley, "The effect of shear on ordered block copolymer solutions," Current Opinion in Colloid & Interface Science, 2000, pp. 342-350, vol. 5.

Fig.5
(a)
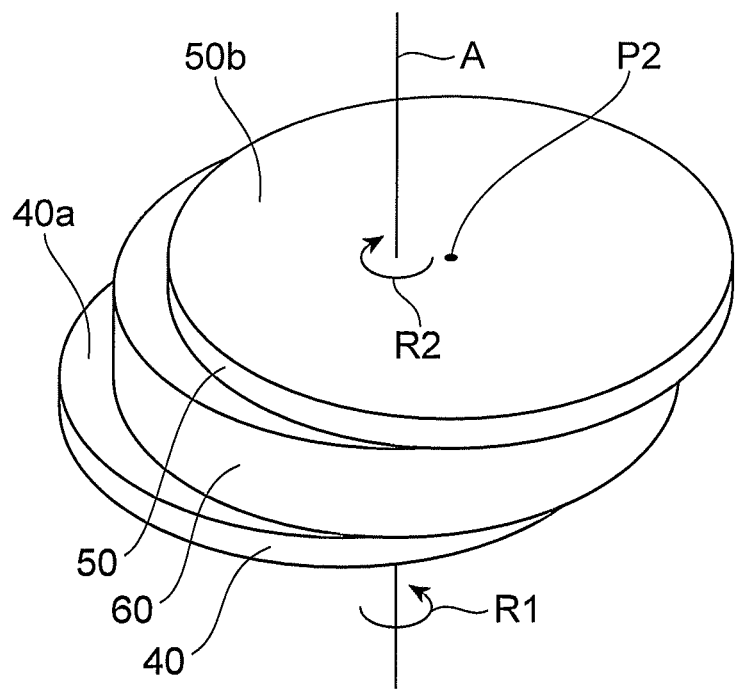
(b)
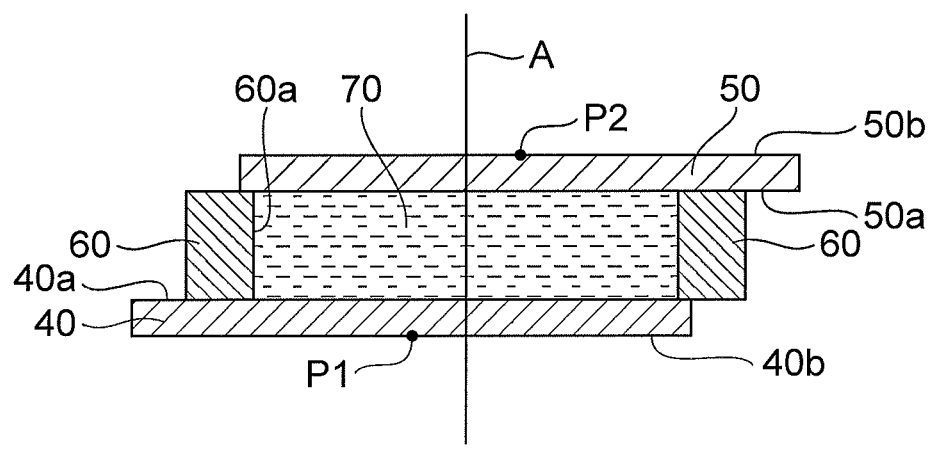

Fig.6
(a)
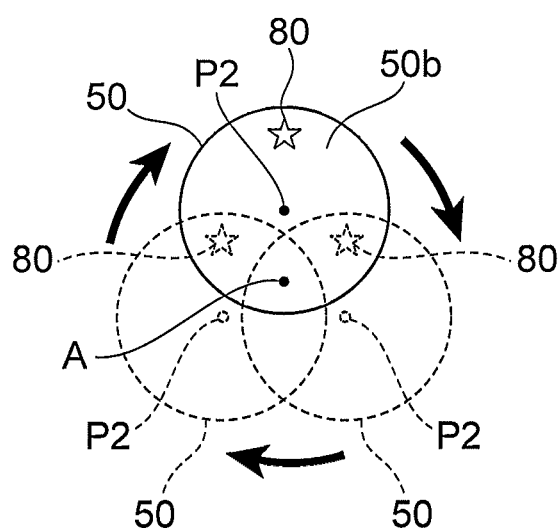
(b)
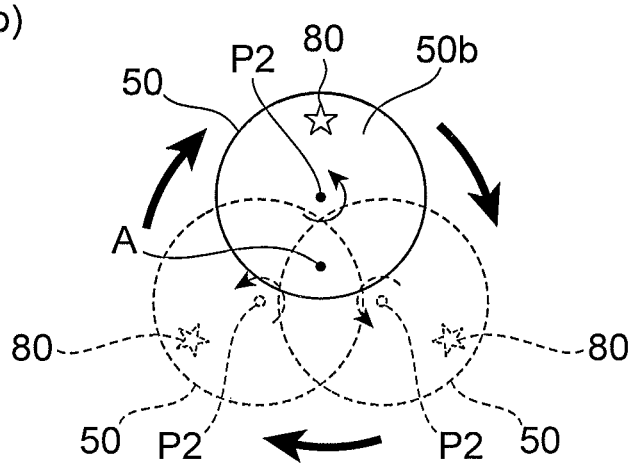

Fig.7
(a)
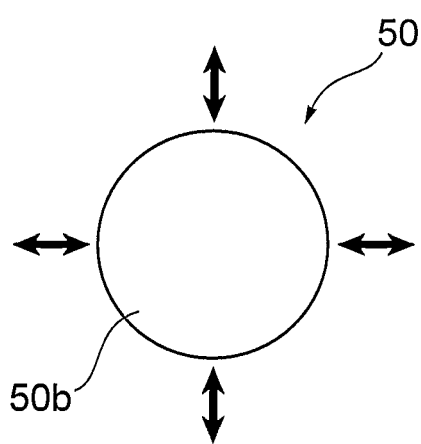
(b)
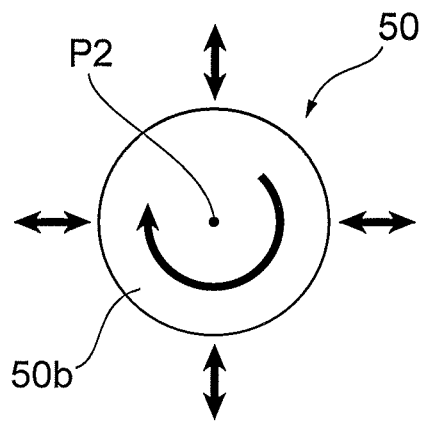

Fig.11
(a)
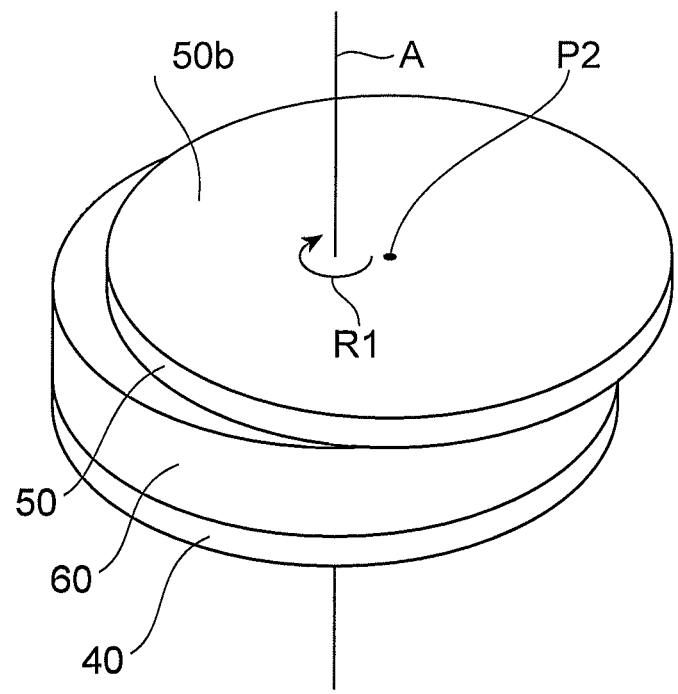
(b)
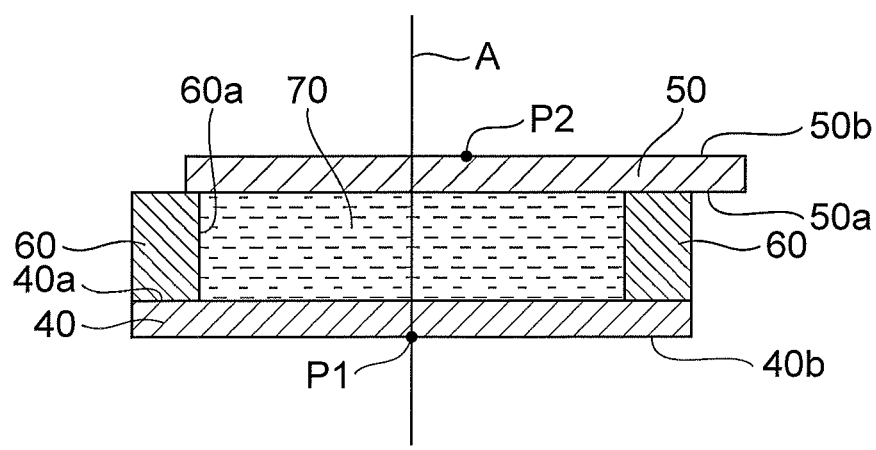

RESIN MOLDED BODY

BACKGROUND OF THE INVENTION

1. Field of the Invention

The present invention relates to a resin molded body, and particularly, to a resin molded body that develops structural colors.

2. Related Background Art

As a resin molded body that develops structural colors, a structural color body is a color body that develops structural colors, and causes phenomena such as reflection, interference, refraction, diffraction and scattering of light due to the microstructure of the color body to develop lights inherent to the microstructure. As a structural color body, a structural body (for example, refer to Patent Documents 1 to 3 listed below) obtained by laminating films with refractive indexes different from each other on a surface with concavities and convexities of a substrate, and a multilayer film (for example, refer to Non-Patent Document 1 listed below) having a curved shape have been proposed.

As a structural color material for forming the structural color body, a photonic crystal having a micro-phase separated structure formed by self-assembly of a block copolymer as a refractive index periodic structure is known (for example, refer to Patent Document 4 listed below). For orientation control of the micro-phase separated structure that influences the optical property of this photonic crystal, for example, methods in which shear flow fields are applied are proposed in Non-Patent Documents 2 to 4 listed below.

Patent Document 1: Japanese Patent Application Laid-Open No. 2007-225935
Patent Document 2: Japanese Patent Application Laid-Open No. 2005-153192
Patent Document 3: Japanese Examined Patent Application Publication No. 4427026
Patent Document 4: Pamphlet of International Publication No. 2008/047514
Non-Patent Document 1: Comparative Physiology and Biochemistry, Vol. 25, No. 3
Non-Patent Document 2: Polymer Journal Vol. 37, No. 12, 900-905 (2005)
Non-Patent Document 3: Macromolecules 32, 3695-3711 (1999)
Non-Patent Document 4: Current Opinion in Colloid & Interface Science 5, 342-350 (2000)

SUMMARY OF THE INVENTION

Structural color development by a lamellar micro-phase separated structure of a block copolymer is caused by a refractive index periodic structure of a one-dimensional multilayer film structure, so that light made incident from a normal direction of lamellar micro domains is reflected at a high intensity and a structural color is observed, however, light made incident from a direction inclined from the normal direction is not reflected in a direction exactly opposite to the incident direction, so that a structural color is hardly observed. Therefore, in a case where a resin molded body having a lamellar micro-phase separated structure is fabricated, when light in the visible light range is made incident on a principal surface of the structural color body having lamellar micro domains oriented parallel to the principal surface of the resin molded body, an angle range in which structural colors are observable tends to become narrow, and a sufficient structural color effect cannot be obtained.

The present invention solves the above-described problem, and an object thereof is to provide a resin molded body that develops structural colors and can widen an angle range in which the structural colors are observable.

A resin molded body according to the present invention has a first principal surface and a second principal surface opposed to each other, wherein the resin molded body comprises a first resin layer containing a block copolymer, the first resin layer has a micro-phase separated structure including lamellar micro domains, each of the micro domains of the first resin layer has a wave-like shape having amplitudes in the opposite direction of the first principal surface and the second principal surface, and in each of the micro domains of the first resin layer, a maximum value of distances in the opposite direction between the tops of convexities and the bottoms of concavities of the micro domain is larger than the wavelength in the visible light range.

On a principal surface of a structural color body having lamellar micro domains oriented parallel to the principal surface, the incident angle range that satisfies the Bragg reflection condition tends to become narrow, so that a structural color tends to become harder to observe when light in the visible light range is made incident on the principal surface from a direction inclined with respect to the thickness direction of the structural color body. On the other hand, in the resin molded body according to the present invention, the first resin layer has a micro-phase separated structure including lamellar micro domains, so that the resin molded body can develop structural colors as a structural color body. In the resin molded body, each of the micro domains of the first resin layer has a wave-like shape having amplitudes in the opposite direction, and in each of the micro domains of the first resin layer, a maximum value of distances in the opposite direction between the tops of convexities and the bottoms of concavities of the micro domain is larger than the wavelength in the visible light range. In this case, even when light in the visible light range is made incident on the principal surface of the resin molded body from a direction inclined with respect to the opposite direction, a region perpendicular to an incident direction of light and a region inclined with respect to an incident direction of light to an extent to satisfy the Bragg reflection condition easily exist in the micro domains of the first resin layer, so that light can be reflected at these regions. Therefore, in the above-described resin molded body, even when light in the visible light range is made incident on the principal surface of the resin molded body from a direction inclined with respect to the opposite direction, light reflected at the first resin layer can be observed as a structural color, so that an angle range in which structural colors are observable can be widened.

In an embodiment of the resin molded body, the resin molded body further comprises a second resin layer and a third resin layer that contain a block copolymer, the first resin layer is disposed on a side of the first principal surface, the second resin layer is disposed on a side of the second principal surface and has a micro-phase separated structure including lamellar micro domains, the third resin layer is disposed between the first resin layer and the second resin layer and has a micro-phase separated structure including lamellar micro domains, each of the micro domains of the second resin layer and the third resin layer has a wave-like shape having amplitudes in the opposite direction, and in each of the micro domains of the second resin layer, a maximum value of distances in the opposite direction between the tops of convexities and the bottoms of concavities of the micro domain is larger than the wavelength in the visible light range, and in each of the micro domains of the third resin layer, distances in the opposite direction between the tops of convexities and the bottoms of concavities of the micro domain are equal to or less than the wavelength in the visible light range.

In the resin molded body, each of the micro domains of the second resin layer has a wave-like shape having amplitudes in the opposite direction, and in each of the micro domains of the second resin layer, a maximum value of the distances in the opposite direction between the tops of convexities and the bottoms of concavities of the micro domain is larger than the wavelength in the visible light range. In this case, like the first resin layer, even when light in the visible light range is made incident on the principal surface of the resin molded body from a direction inclined with respect to the opposite direction, light reflected at the second resin layer can be observed as a structural color. Also, in the resin molded body, each of the micro domains of the third resin layer has a wave-like shape having amplitudes in the opposite direction, and in each of the micro domains of the third resin layer, the distances in the opposite direction between the tops of convexities and the bottoms of concavities of the micro domain are equal to or less than the wavelength in the visible light range. In this case, a region perpendicular to an incident direction of light in the visible light range made incident from a direction inclined with respect to the opposite direction and a region inclined with respect to the incident direction of the light to an extent to satisfy the Bragg reflection condition hardly exist in the third resin layer as compared with the first resin layer and the second resin layer. Although this third resin layer easily reflects light in the visible light range made incident in the opposite direction, the third resin layer hardly reflects light in the visible light range made incident from the direction inclined with respect to the opposite direction as compared with the first resin layer and the second resin layer. In this resin molded body, when the principal surface of the resin molded body is observed from the opposite direction, light reflected at the third resin layer is easily observed as well as lights reflected at the first resin layer and the second resin layer, and on the other hand, when the principal surface of the resin molded body is observed from the direction inclined with respect to the opposite direction, although the lights reflected at the first resin layer and the second resin layer are easily observed, the light reflected at the third resin layer is hardly observed. Therefore, in the resin molded body, various structural colors depending on observation angles can be observed. In addition, in the resin molded body, when either the first principal surface or the second principal surface is observed, an angle range in which structural colors are observable can be widened, and various structural colors depending on observation angles can be observed.

In an embodiment of the resin molded body, the resin molded body further comprises a second resin layer and a third resin layer that contain a block copolymer, the first resin layer is disposed on a side of the first principal surface, the second resin layer is disposed on a side of the second principal surface and has a micro-phase separated structure including lamellar micro domains, the third resin layer is disposed between the first resin layer and the second resin layer and has a micro-phase separated structure including lamellar micro domains, each of the micro domains of the second resin layer has a wave-like shape having amplitudes in the opposite direction, and in each of the micro domains of the second resin layer, a maximum value of distances in the opposite direction between the tops of convexities and the bottoms of concavities of the micro domain is larger than the wavelength in the visible light range, and each of the micro domains of the third resin layer is oriented substantially parallel to at least one of the first principal surface or the second principal surface.

In the resin molded body, each of the micro domains of the second resin layer has a wave-like shape having amplitudes in the opposite direction, and in each of the micro domains of the second resin layer, a maximum value of distances in the opposite direction between the tops of convexities and the bottoms of concavities of the micro domain is larger than the wavelength in the visible light range. In this case, like the first resin layer, even when light in the visible light range is made incident on the principal surface of the resin molded body from a direction inclined with respect to the opposite direction, light reflected at the second resin layer can be observed as a structural color. In the resin molded body, each of the micro domains of the third resin layer is oriented substantially parallel to at least one of the first principal surface or the second principal surface. In this case, a region perpendicular to an incident direction of light in the visible light range made incident from a direction inclined with respect to the opposite direction and a region inclined with respect to the incident direction of the light to an extent to satisfy the Bragg reflection condition hardly exist in the third resin layer as compared with the first resin layer and the second resin layer. Although this third resin layer easily reflects light in the visible light range made incident in the opposite direction, the third resin layer hardly reflects light in the visible light range made incident from the direction inclined with respect to the opposite direction as compared with the first resin layer and the second resin layer. In this resin molded body, when the principal surface of the resin molded body is observed from the opposite direction, light reflected at the third resin layer is easily observed as well as lights reflected at the first resin layer and the second resin layer, and on the other hand, when the principal surface of the resin molded body is observed from the direction inclined with respect to the opposite direction, although the lights reflected at the first resin layer and the second resin layer are easily observed, the light reflected at the third resin layer is hardly observed. Therefore, in the resin molded body, various structural colors depending on observation angles can be observed. In addition, in the resin molded body, when either the first principal surface or the second principal surface is observed, an angle range in which structural colors are observable can be widened, and various structural colors depending on observation angles can be observed.

In an embodiment of the resin molded body, the resin molded body further comprises a second resin layer containing a block copolymer, the first resin layer is disposed on a side of the first principal surface, the second resin layer is disposed on a side of the second principal surface and has a micro-phase separated structure including lamellar micro domains, each of the micro domains of the second resin layer has a wave-like shape having amplitudes in the opposite direction, and in each of the micro domains of the second resin layer, distances in the opposite direction between the tops of convexities and the bottoms of concavities of the micro domain are equal to or less than the wavelength in the visible light range.

In the resin molded body, each of the micro domains of the second resin layer has a wave-like shape having amplitudes in the opposite direction, and in each of the micro domains of the second resin layer, distances in the opposite direction between the tops of convexities and the bottoms of concavities of the micro domain are equal to or less than the wavelength in the visible light range. In this case, a region perpendicular to an incident direction of light in the visible light range made incident from a direction inclined with respect to the opposite direction and a region inclined with respect to the incident direction of the light to an extent to satisfy the Bragg reflection condition hardly exist in the second resin layer as compared with the first resin layer. Although this second resin layer easily reflects light in the visible light range made incident in the opposite direction, the second resin layer hardly reflects light in the visible light range made incident from the direction inclined with respect to the opposite direction as compared with the first resin layer. In this resin molded body, when the principal surface of the resin molded body is observed from the opposite direction, light reflected at the second resin layer is easily observed as well as light reflected at the first resin layer, and on the other hand, when the principal surface of the resin molded body is observed from the direction inclined with respect to the opposite direction, although the light reflected at the first resin layer is easily observed, the light reflected at the second resin layer is hardly observed. Therefore, in the resin molded body, various structural colors depending on observation angles can be observed. In addition, in the resin molded body, when either the first principal surface or the second principal surface is observed, an angle range in which structural colors are observable can be widened, and various structural colors depending on observation angles can be observed.

In an embodiment of the resin molded body, the resin molded body further comprises a second resin layer containing a block copolymer, the first resin layer is disposed on a side of the first principal surface, the second resin layer is disposed on a side of the second principal surface and has a micro-phase separated structure including lamellar micro domains, and each of the micro domains of the second resin layer is oriented substantially parallel to at least one of the first principal surface or the second principal surface.

In the resin molded body, each of the micro domains of the second resin layer is oriented substantially parallel to at least one of the first principal surface or the second principal surface. In this case, a region perpendicular to an incident direction of light in the visible light range made incident from a direction inclined with respect to the opposite direction and a region inclined with respect to the incident direction of the light to an extent to satisfy the Bragg reflection condition hardly exist in the second resin layer as compared with the first resin layer. Although this second resin layer easily reflects light in the visible light range made incident in the opposite direction, the second resin layer hardly reflects light in the visible light range made incident from the direction inclined with respect to the opposite direction as compared with the first resin layer. In this resin molded body, when the principal surface of the resin molded body is observed from the opposite direction, light reflected at the second resin layer is easily observed as well as light reflected at the first resin layer, and on the other hand, when the principal surface of the resin molded body is observed from the direction inclined with respect to the opposite direction, although the light reflected at the first resin layer is easily observed, the light reflected at the second resin layer is hardly observed. Therefore, in the resin molded body, various structural colors depending on observation angles can be observed. In addition, in the resin molded body, when either the first principal surface or the second principal surface is observed, an angle range in which structural colors are observable can be widened, and various structural colors depending on observation angles can be observed.

In an embodiment of the resin molded body, the resin molded body is composed of a first resin layer. Even in this case, when either the first principal surface or the second principal surface is observed, an angle range in which structural colors are observable can be widened.

The thickness in the opposite direction of the resin molded body is preferably more than 1000 μm and not more than 3000 μm. In this case, an angle range in which structural colors are observable can be easily widened.

The resin molded body according to the present invention develops structural colors and can widen an angle range (inclined angle range with respect to the opposite direction of the principal surfaces of the resin molded body) in which the structural colors are observable. The resin molded body according to the present invention can be easily fabricated without requiring a complicated step such as vacuum semiconductor process.

BRIEF DESCRIPTION OF THE DRAWINGS

FIG. 5 is a view showing a step of a method for manufacturing the resin molded body according to the embodiment of the present invention.

FIG. 6 is a view showing a step of a method for manufacturing the resin molded body according to the embodiment of the present invention.

FIG. 7 is a view showing a step of a method for manufacturing the resin molded body according to the embodiment of the present invention.

FIG. 11 is a view showing a step of a method for manufacturing the resin molded body according to another embodiment of the present invention.

DESCRIPTION OF THE PREFERRED EMBODIMENTS

Hereinafter, embodiments of the present invention are described in detail with reference to the drawings.

First Embodiment

Resin Molded Body

Figure 1:
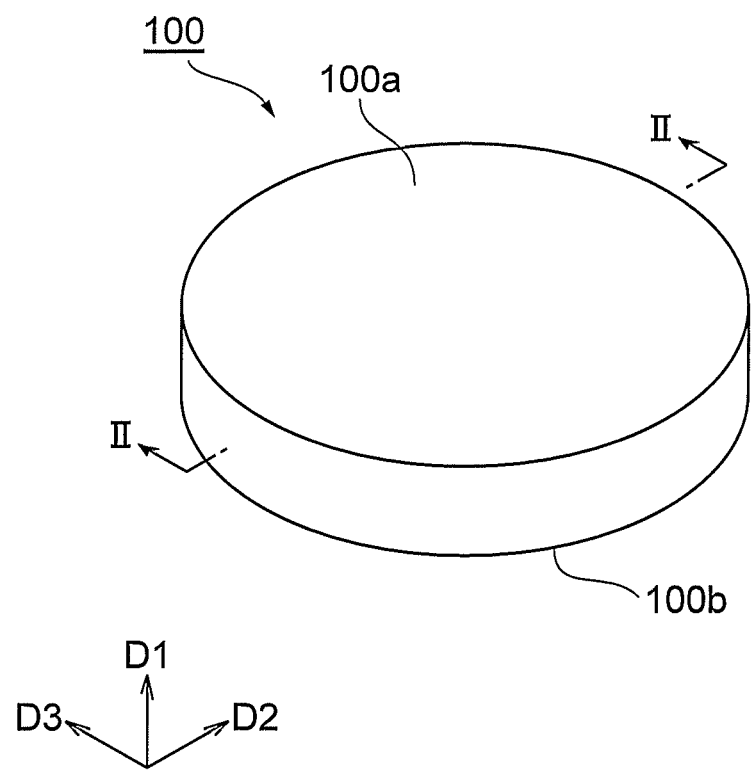
FIG. 1 is a perspective view showing a resin molded body according to an embodiment of the present invention.
Figure 2:
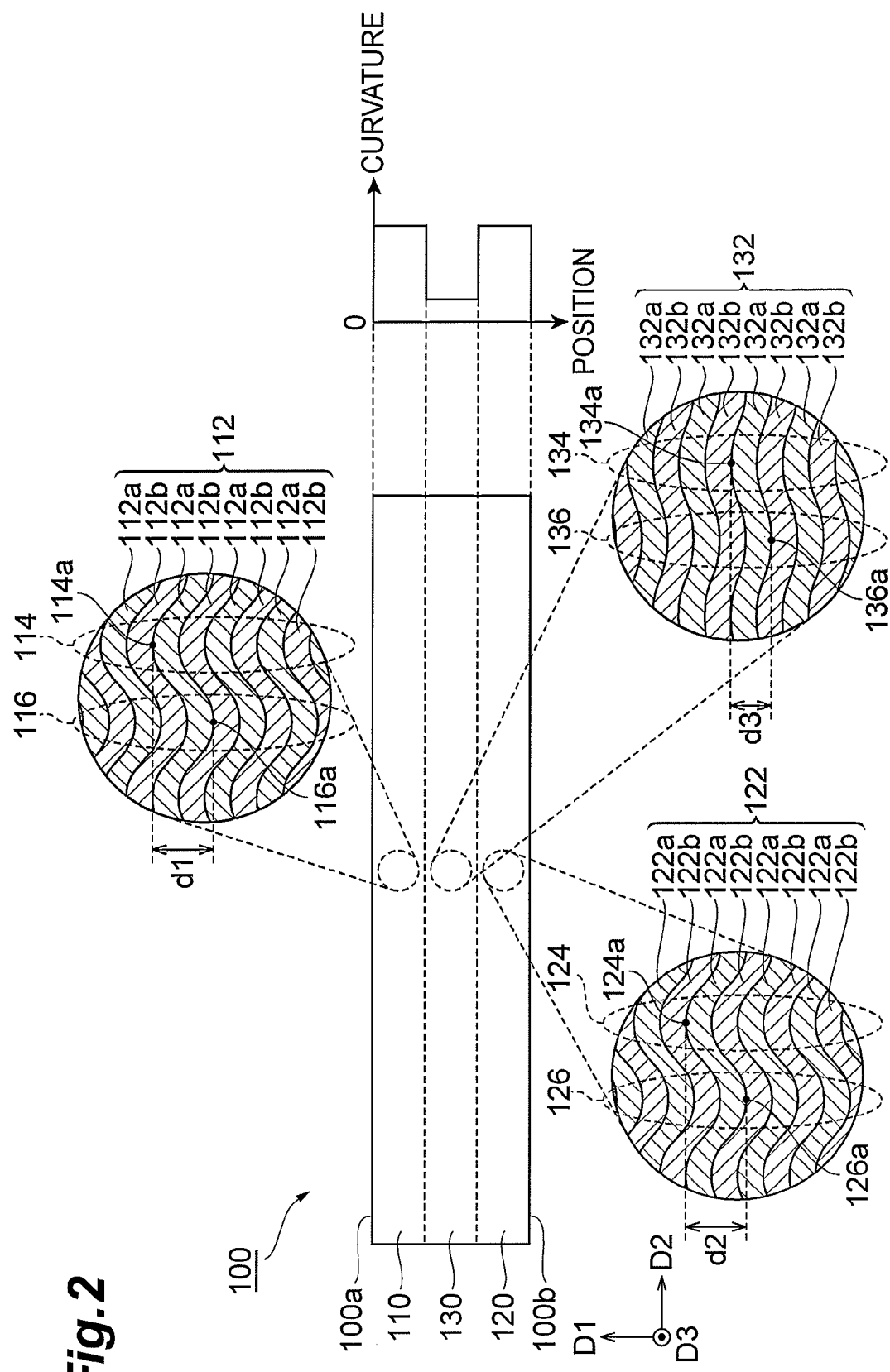
FIG. 2 is a schematic sectional view taken along line II-II in FIG. 1.

FIG. 1 is a perspective view showing a resin molded body according to a first embodiment. FIG. 2 is a schematic sectional view taken along line II-II in FIG. 1. The resin molded body (structural color body) 100 according to the first embodiment is, for example, cylindrical, and has a front surface (first principal surface) 100a and a back surface (second principal surface) 100b opposed substantially parallel to each other. The thickness of the resin molded body 100 in the opposite direction D1 of the front surface 100a and the back surface 100b is preferably more than 1000 μM and not more than 3000 μm.

The resin molded body 100 comprises a front surface layer (first resin layer) 110 disposed on the front surface 100a side, a back surface layer (second resin layer) 120 disposed on the back surface 100b side, and an intermediate layer (third resin layer) 130 disposed between the front surface layer 110 and the back surface layer 120. The resin molded body 100 is formed by laminating the back surface layer 120, the intermediate layer 130 and the front surface layer 110 in this order. The intermediate layer 130 is in contact with the front surface layer 110 and the back surface layer 120 between the front surface layer 110 and the back surface layer 120.

The thickness of at least one kind selected from the group consisting of the front surface layer 110 and the back surface layer 120 is preferably 300 to 1000 μm. The thickness of the intermediate layer 130 is preferably 400 to 1000 μm.

The front surface layer 110, the back surface layer 120 and the intermediate layer 130 of the resin molded body 100 are made by polymer photonic crystals. The polymer photonic crystal contains a block copolymer (polymer block copolymer). The front surface layer 110, the back surface layer 120 and the intermediate layer 130 contain, for example, block copolymers of the same kind. A "block copolymer" is a copolymer formed by bonding two or more kinds of polymer chains (segments) each other, and is, for example, a copolymer in which the ends of a first polymer chain whose structural unit is monomer A and a second polymer chain whose structural unit is monomer B are linked to each other.

The block copolymer is, for example, a binary block copolymer such as polystyrene-b-poly(methylmethacrylate), polystyrene-b-poly(ethylmethacrylate), polystyrene-b-poly(propylmethacrylate), polystyrene-b-poly(tert-butylmethacrylate), polystyrene-b-poly(n-butylmethacrylate), polystyrene-b-poly(isopropylmethacrylate), polystyrene-b-poly(pentylmethacrylate), polystyrene-b-poly(hexylmethacrylate), polystyrene-b-poly(decylmethacrylate), polystyrene-b-poly(dodecylmethacrylate), polystyrene-b-poly(methylacrylate), polystyrene-b-poly(tert-butylacrylate), polystyrene-b-polybutadiene, polystyrene-b-polyisoprene, polystyrene-b-polydimethylsiloxane, polybutadiene-b-polydimethylsiloxane, polyisoprene-b-polydimethylsiloxane, polyvinylpyridine-b-poly(methylmethacrylate), polyvinylpyridine-b-poly(tert-butylmethacrylate), polyvinylpyridine-b-polybutadiene, polyvinylpyridine-b-isoprene, polybutadiene-b-polyvinylnaphthalene, polyvinylnaphthalene-b-poly(methylmethacrylate), and polyvinylnaphthalene-b-poly(tert-butylmethacrylate); a ternary block copolymer such as polystyrene-b-polybutadiene-b-poly(methylmethacrylate), polystyrene-b-polybutadiene-b-poly(tert-butylmethacrylate), polystyrene-b-polyisoprene-b-poly(methylmethacrylate), polystyrene-b-polyisoprene-b-poly(tert-butylmethacrylate), etc. The block copolymer is not limited to the above-described block copolymers as long as its refractive index differs between polymer chains. FIG. 2 shows a mode in which the front surface layer 110, the back surface layer 120 and the intermediate layer 130 contain binary block copolymers as block copolymers by way of example.

The lower limit of the weight-average molecular weight (Mw) of the block copolymer in at least one kind selected from the group consisting of the front surface layer 110, the back surface layer 120 and the intermediate layer 130 is preferably equal to or more than $8.0 \times 10^5$ (g/mol), more preferably equal to or more than $9.0 \times 10^5$ (g/mol), and still more preferably equal to or more than $1.0 \times 10^6$ (g/mol) in order to satisfactorily obtain a periodic structure necessary for a structural color body to exhibit chromogenic performance. The upper limit of the weight-average molecular weight is preferably equal to or less than $3.0 \times 10^6$ (g/mol), more preferably equal to or less than $2.5 \times 10^6$ (g/mol), and still more preferably equal to or less than $2.0 \times 10^6$ (g/mol) in order to satisfactorily obtain a periodic structure necessary for a structural color body to exhibit chromogenic performance. It is more preferable that the weight-average molecular weights of the block copolymers in the front surface layer 110, the back surface layer 120 and the intermediate layer 130 satisfy the above-described ranges. The weight-average molecular weight can be obtained as a weight-average molecular weight in terms of polystyrene conversion by using gel permeation chromatography (GPC).

The front surface layer 110, the back surface layer 120 and the intermediate layer 130 have micro-phase separated structures. The "micro-phase separated structure" is an assembly of a plurality of micro domains arranged periodically. The "micro domains" are phases formed by phase-separating different kinds of polymer chains of the block copolymer from each other without mixing.

The micro-phase separated structure of the front surface layer 110 includes lamellar micro domains 112 consisting of micro domains 112a and micro domains 112b, and is a refractive index periodic structure formed by alternately laminating the micro domains 112a and the micro domains 112b. The micro domains 112a contain one polymer chain of the block copolymer as a major constituent, and the micro domains 112b contain the other polymer chain of the block copolymer as a major constituent.

The micro-phase separated structure of the back surface layer 120 includes lamellar micro domains 122 consisting of micro domains 122a and micro domains 122b, and is a refractive index periodic structure formed by alternately laminating the micro domains 122a and the micro domains 122b. The micro domains 122a contain one polymer chain of the block copolymer as a major constituent, and the micro domains 122b contain the other polymer chain of the block copolymer as a major constituent.

The micro-phase separated structure of the intermediate layer 130 includes lamellar micro domains 132 consisting of micro domains 132a and micro domains 132b, and is a refractive index periodic structure formed by alternately laminating the micro domains 132a and the micro domains 132b. The micro domains 132a contain one polymer chain of the block copolymer as a major constituent, and the micro domains 132b contain the other polymer chain of the block copolymer as a major constituent.

Each of the micro domains 112 of the front surface layer 110 has a wave-like shape (concavo-convex shape) having amplitudes in the direction D1. Each of the micro domains 112 includes convexities 114 convexed in the direction D1 and concavities 116 concaved in the direction D1 alternately along a direction substantially perpendicular to the direction D1. Similarly, each of the micro domains 122 of the back surface layer 120 has a wave-like shape (concavo-convex shape) having amplitudes in the direction D1. Each of the micro domains 122 includes convexities 124 convexed in the direction D1 and concavities 126 concaved in the direction D1 alternately along a direction substantially perpendicular to the direction D1. Each of the micro domains 132 of the intermediate layer 130 has a wave-like shape (concavo-convex shape) having amplitudes in the direction D1. Each of the micro domains 132 has convexities 134 convexed in the direction D1 and concavities 136 concaved in the direction D1 alternately along a direction substantially perpendicular to the direction D1.

The micro domains 112, the micro domains 122 and the micro domains 132 have two-dimensional or one-dimensional alignment of concavities and convexities. For example, convexities and concavities in each micro domain may be arranged alternately along a direction D2 substantially perpendicular to the direction D1 and arranged alternately along a direction D3 substantially perpendicular to the direction D1 and the direction D2 (two-dimensional alignment of concavities and convexities), or may be arranged to be long in the direction D3 and alternately along the direction D2 (one-dimensional alignment of concavities and convexities). The wave axes of each micro domain are preferably substantially parallel to at least one of the front surface 100a or the back surface 100b. Each micro domain preferably has concavities and convexities isotropically curved in the direction D2 and the direction D3, and the persistence length of the concavities and convexities is preferably long in the direction D2 and the direction D3.

In each of the micro domains of the front surface layer 110, the back surface layer 120 and the intermediate layer 130, the distances in the direction D1 between the tops of convexities and the bottoms of concavities of the micro domain are adjusted based on a predetermined wavelength $\lambda 1$. In detail, in each of the micro domains 112 (micro domains 112a and 112b) of the front surface layer 110, a maximum value of the distances d1 in the direction D1 between the tops (for example, apexes) 114a of convexities 114 and the bottoms (for example, bottom points) 116a of concavities 116 of the micro domain 112 is larger than the wavelength $\lambda 1$.

Here, each micro domain 112 includes pluralities of tops 114a and bottoms 116a respectively, and a maximum value of the distances d1 in one micro domain 112 is the largest value among distances in the direction D1 each of which is between a top 114a selected among the plurality of tops 114a and a bottom 116a selected among the plurality of bottoms 116a of the micro domain 112. The top 114a and the bottom 116a providing the maximum value of the distance d1 may be adjacent to each other or not adjacent to each other. In a cross-section obtained by cutting the resin molded body 100 substantially parallel to the direction D1, when the micro domain 112 has at least one distance d1 larger than the wavelength $\lambda 1$, the maximum value of the distances d1 in this micro domain 112 becomes larger than the wavelength $\lambda 1$.

Similarly, in each of the micro domains 122 (micro domains 122a and 122b) of the back surface layer 120, a maximum value of distances d2 in the direction D1 between the tops (for example, apexes) 124a of convexities 124 and the bottoms (for example, bottom points) 126a of concavities 126 of the micro domain 122 is larger than the wavelength $\lambda 1$.

On the other hand, in each of the micro domains 132 (micro domains 132a and 132b) of the intermediate layer 130, the distances d3 in the direction D1 between the tops (for example, apexes) 134a of convexities 134 and the bottoms (for example, bottom points) 136a of concavities 136 of the micro domain 132 are either equal to or less than the wavelength $\lambda 1$. This micro domain 132 has an optically flat shape.

As a target wavelength of the structural color body, the wavelength $\lambda 1$ is the wavelength in the visible light range (for example, 350 to 700 nm). For example, the maximum values of the distances d1 and d2 are larger than 350 nm, and the distances d3 are equal to or less than 350 nm. On a structural color body formed by alternately laminating micro domains with a high refractive index (refractive index n1, thickness t1) and micro domains with a low refractive index (refractive index n2 (n2<n1), thickness t2), when light is made incident from a direction perpendicular to the principal surface of this structural color body, light with the wavelength $\lambda 2$ expressed by the following equation (1) is selectively intensified in this structural color body and easily observed as a structural color. The wavelength $\lambda 1$ is more preferably the wavelength $\lambda 2$.

$$\text{Wavelength } \lambda 2 = 2 \times (n1 \times t1 + n2 \times t2) \tag{1}$$

Figure 3:
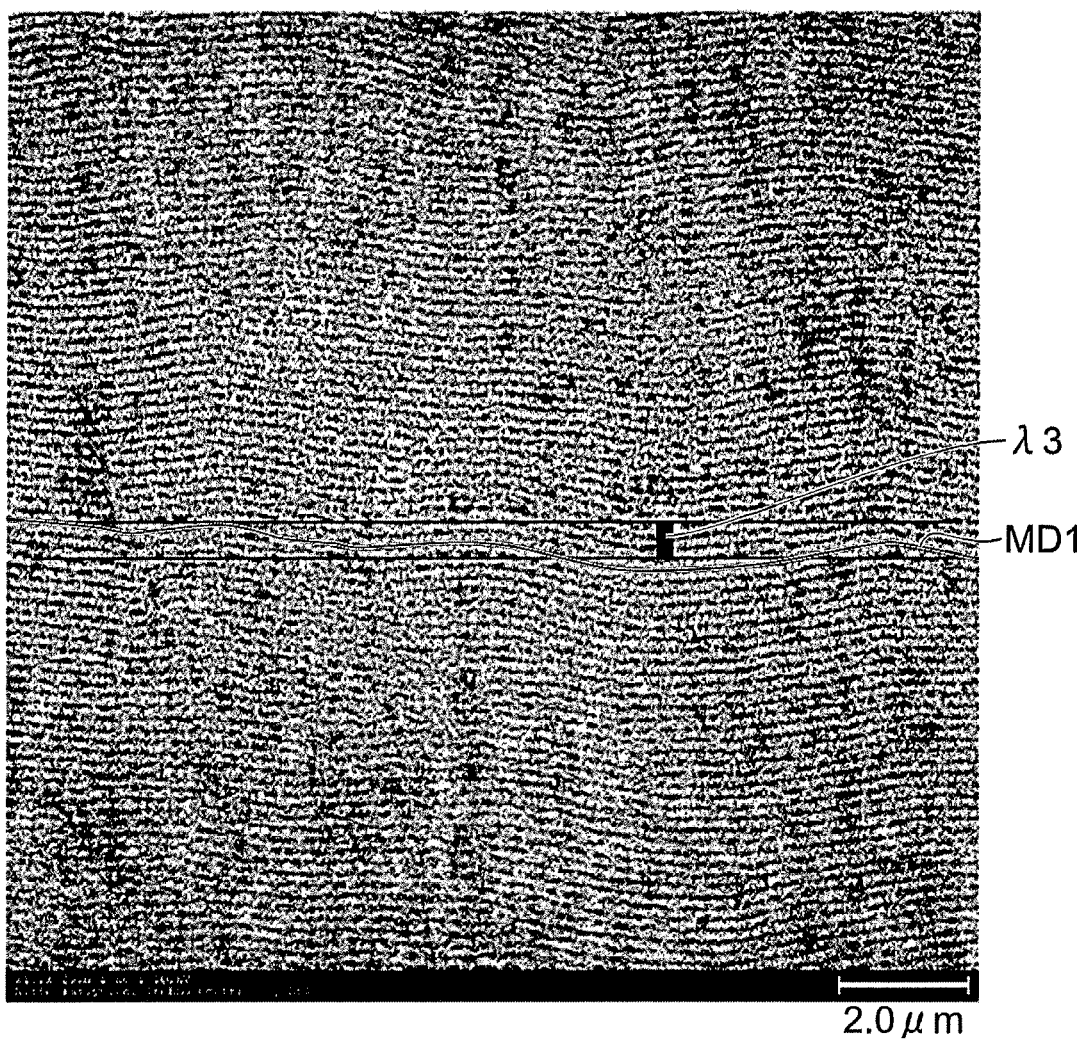
FIG. 3 is a view showing an example of a cross-section of one resin layer in the resin molded body.

FIG. 3 is a view (TEM photograph) showing an example of a cross-section of the front surface layer 110 in the resin molded body 100. In the micro domain MD1 included in the front surface layer 110, the distances d1 in the opposite direction of the principal surfaces of the resin molded body 100 between the tops of convexities and the bottoms of concavities of the micro domain MD1 are larger than the wavelength (wavelength: 530 nm) $\lambda 3$ in the visible light range.

Figure 4:
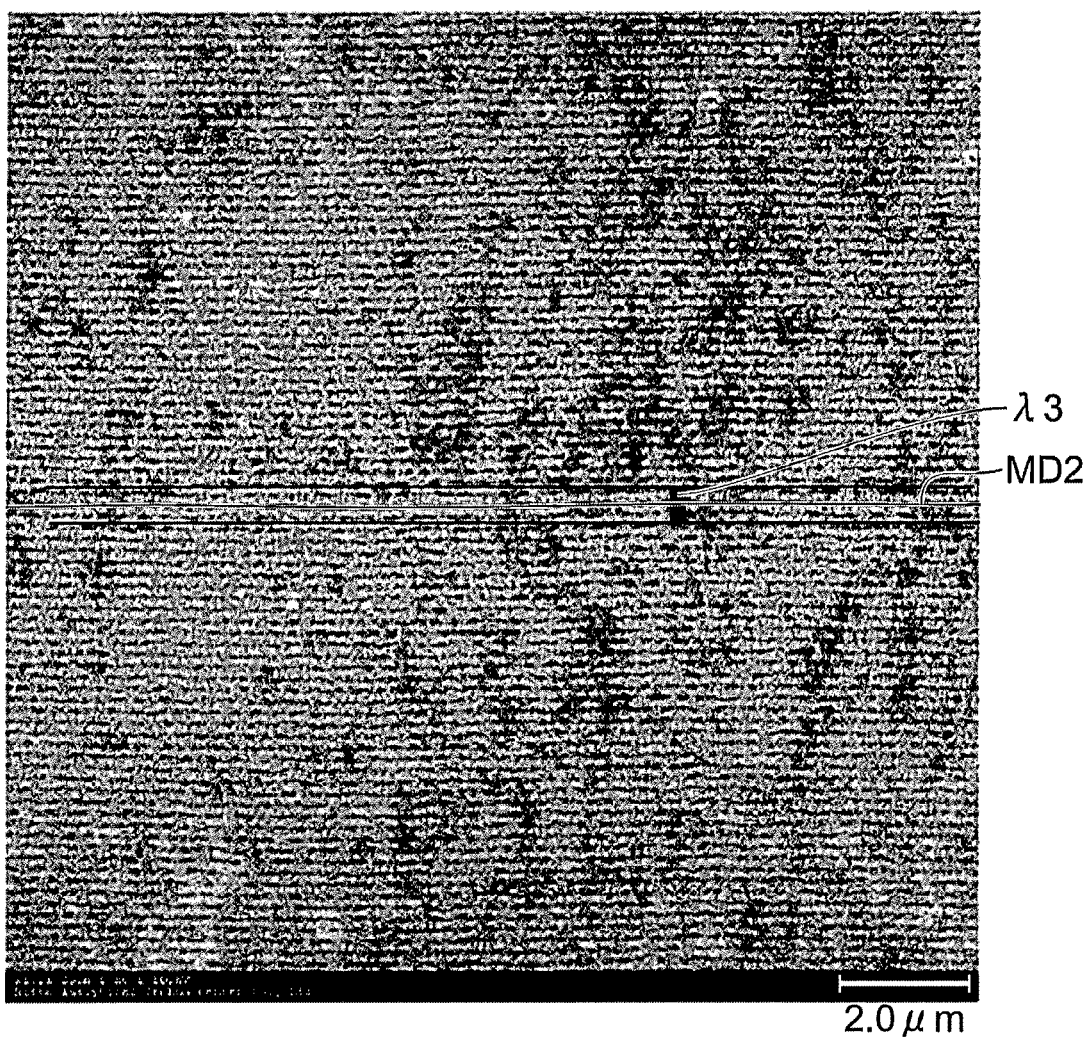
FIG. 4 is a view showing an example of a cross-section of another resin layer in the resin molded body.

FIG. 4 is a view (TEM photograph) showing an example of a cross-section of the intermediate layer 130 in the resin molded body 100. In the micro domain MD2 included in the intermediate layer 130, the distances d3 in the opposite direction of the principal surfaces of the resin molded body 100 between the tops of convexities and the bottoms of concavities of the micro domain MD2 are equal to or less than the wavelength $\lambda 3$ in the visible light range.

Polymer photonic crystals which form the front surface layer 110, the back surface layer 120 and the intermediate layer 130 preferably further contain, as a constituent other than the block copolymer, a photocurable resin (polymer compound) obtained by photopolymerizing a composition containing a photopolymerizable monomer that can dissolve the block copolymer and a photopolymerization initiator described later as a monomeric component under the presence of the photopolymerization initiator. The photopolymerizable monomer is preferably at least one kind selected from the group consisting of acrylates and methacrylates. The photopolymerizable monomer may be either a monofunctional monomer or a polyfunctional monomer, and is, for example, a monofunctional monomer such as carboxyethylacrylate, isobornyl acrylate, octylacrylate, laurylacrylate, stearylacrylate, nonylphenoxy polyethylene glycol acrylate, dicyclopentenylacrylate, dicyclopentenyloxyethylacrylate, dicyclopentanylacrylate, benzylacrylate, phenoxyethylacrylate, dicyclopentenyloxyethylmethacrylate, dicyclopentanylmethacrylate, benzylmethacrylate, octylmethacrylate and 2-ethyl hexyl-diglycol acrylate; a polyfunctional monomer such as diethyleneglycol acrylate, 1,4-butanediol diacrylate, 1,6-hexanediol acrylate, 1,9-nonanediol diacrylate, polypropyleneglycol diacrylate, EO modified bisphenol A diacrylate, dicyclopentanyldiacrylate, neopentylglycol-modified trimethylolpropanediacrylate, 4,4'-diacryloyloxy stilbene, diethyleneglycol methacrylate, 1,4-butanediol dimethacrylate, 1,6-hexanediol methacrylate, 1,9-nonanediol dimethacrylate, dicyclopentanyl dimethacrylate, neopentylglycol dimethacrylate, EO modified bisphenol A dimethacrylate, tris(2-acryloyloxyethyl)isocyanurate and caprolactone modified dipentaerythritol hexaacrylate. The photopolymerizable monomer is preferably a polyfunctional monomer, and is more preferably dicyclopentanylacrylate, neopentylglycol modified trimethylolpropane diacrylate, 1,4-butanediol diacrylate, 1,6-hexanediol acrylate, 1,9-nonanediol diacrylate, or caprolactone modified dipentaerythritol hexaacrylate. A single photopolymerizable monomer may be used, or two or more kinds may be mixed and used. The content of the photocurable resin is preferably 40 to 90% by mass with reference to the total mass of the resin molded body 100.

The polymer photonic crystals which form the front surface layer 110, the back surface layer 120 and the intermediate layer 130 may contain other constituents such as a plasticizer. The plasticizer is, for example, at least one kind selected from the group consisting of phthalate ester such as dioctyl phthalate, adipate ester, phosphate ester, trimellitate ester, citrate ester, epoxy compound, and polyester. By containing these plasticizers in the resin molded body 100, the regularity of the micro-phase separated structure can be improved. The content of the plasticizers is preferably 5 to 50% by mass with reference to the total mass of the resin molded body 100.

(Method for Manufacturing Resin Molded Body)

A method for manufacturing the resin molded body 100 according to the first embodiment comprises, for example, a flow field applying step (first step) in which shear flow fields are applied to a solution containing a block copolymer, a photopolymerization initiator, and a photopolymerizable monomer capable of dissolving the block copolymer and the photopolymerization initiator by moving a first member and a second member relative to the solution in directions different from each other substantially parallel to at least one of the principal surface of the first member or the principal surface of the second member opposed to each other in a state where the solution is interposed between the principal surface of the first member and the principal surface of the second member, and a photopolymerizing step (second step) in which a resin molded body (structural color body) having a micro-phase separated structure including lamellar micro domains is obtained by polymerizing the photopolymerizable monomer by irradiating the solution with light after the flow field applying step. The above-described manufacturing method may further comprise a solution preparing step before the flow field applying step. The above-described manufacturing method may further comprise an annealing step between the flow field applying step and the photopolymerizing step.

In the solution preparing step, first, the block copolymer having the above-described polymer chains is polymerized. A method for polymerizing the block copolymer capable of forming lamellar micro domains is, for example, living anion polymerization, etc.

Next, by dissolving the block copolymer and the photopolymerization initiator in the photopolymerizable monomer capable of dissolving the block copolymer and the photopolymerization initiator, a polymer solution containing the block copolymer, the photopolymerization initiator and the photopolymerizable monomer is prepared. The polymer solution may contain other constituents such as the above-described plasticizers. In this stage of preparation of the above-described polymer solution, the block copolymer may form a micro-phase separated structure whose orientation is not controlled.

The content of the block copolymer in the polymer solution is preferably 3 to 30% by mass, more preferably 5 to 20% by mass, and still more preferably 7 to 15% by mass with reference to the total mass of the polymer solution to obtain a polymer solution that does not need to be heated for reducing the viscosity in the fabrication process and is low in viscosity to some extent and has fluidity at a room temperature. If the content of the block copolymer is less than 3% by mass, segregation power when forming the micro-phase separated structure tends to decrease, and the regularity of the micro-phase separated structure tends to deteriorate. If the content of the block copolymer is more than 30% by mass, although the segregation power increases, the viscosity increases and the orientation control by flow field application tends to become difficult.

The photopolymerization initiator is a polymerization initiator that can be activated by activated light irradiation. As the photopolymerization initiator, a radical photopolymerization initiator that increases the molecular weight (crosslinking) of a material to promote gelatinization of by causing molecules to cleave according to activated light irradiation and become radical and by causing a radical polymerization reaction with a photopolymerizable polymer or monomer can be used. Examples of the photopolymerization initiator include benzyldimethylketal, α-hydroxyalkylphenone, α-aminoalkylphenone and the like. In detail, as the photopolymerization initiator, IRGACURE 651 (made by Ciba Specialty Chemicals) etc., can be used. These photopolymerization initiators may be used alone, or two or more kinds may be mixed and used. The content of the photopolymerization initiator is preferably 0.05 to 0.5% by mass with reference to the total mass of the photopolymerizable monomer.

Next, the flow field applying step is described with reference to FIG. 5. First, a plate-shaped member (first member) 40 having flat principal surfaces 40*a* and 40*b* opposed substantially parallel to each other and a plate-shaped member (second member) 50 having flat principal surfaces 50*a* and 50*b* opposed substantially parallel to each other are prepared. The plate-shaped members 40 and 50 are circular, for example. The plate-shaped members 40 and 50 are made of quartz glass, for example. The diameters of the plate-shaped members 40 and 50 are preferably 20 to 500 mm. The thicknesses of the plate-shaped members 40 and 50 are preferably 0.5 to 10 mm. The shapes, constituent materials and sizes of the plate-shaped members 40 and 50 may be the same as each other or different from each other.

Subsequently, an annular (ring-shaped) spacer 60 having a circular opening 60*a* is disposed on the principal surface 40*a* of the plate-shaped member 40. The spacer 60 is preferably disposed so that the center of the opening 60*a* opposes the center of the principal surface 40*a*. The outer diameter of the spacer 60 is, for example, 20 to 500 mm, and the thickness of the spacer 60 is adjusted according to the thickness of a resin molded body to be fabricated.

Next, after a polymer solution 70 is developed inside the opening 60*a*, the plate-shaped member 50 is disposed on the polymer solution 70 so that the center point P1 of the principal surface 40*b* and the center point P2 of the principal surface 50*b* do not oppose each other in the thickness direction of the polymer solution 70, and the principal surface 40*a* and the principal surface 50*a* oppose substantially parallel to each other. Accordingly, the polymer solution 70 is held between the plate-shaped member 40 and the plate-shaped member 50 while being in contact with the principal surface 40*a* and the principal surface 50*a*. It is also possible that after the plate-shaped member 40 and the plate-shaped member 50 are disposed to oppose each other so that the principal surface 40*a* and the principal surface 50*a* become substantially parallel to each other, the polymer solution 70 is injected between the principal surface 40*a* and the principal surface 50*a*.

The thickness of the polymer solution 70 is preferably more than 1000 μm and not more than 3000 μm in order to satisfactorily obtain a periodic structure necessary for the structural color body to exhibit chromogenic performance.

Subsequently, in a state where the polymer solution 70 is interposed between the principal surface 40*a* and the principal surface 50*a*, shear flow fields are applied to the polymer solution 70. In detail, by moving the plate-shaped member 40 and the plate-shaped member 50 relative to the polymer solution 70 in directions different from each other so as to move in a plurality of directions substantially parallel to at least one of the principal surface 40*a* or the principal surface 50*a*, shear flow fields are applied to the polymer solution 70. For example, as shown in FIG. 5, around a reference axis A that does not pass through the center point P1 of the principal surface 40b and the center point P2 of the principal surface 50b and is substantially perpendicular to the principal surface 40b and 50b, the plate-shaped member 40 is turned (revolved) in a direction R1 and the plate-shaped member 50 is turned (revolved) in a direction R2 opposite to the direction R1, substantially parallel to the principal surfaces 40a and 50a. The plate-shaped member 40 and the plate-shaped member 50 are preferably turned at the same rotating speed in directions opposite to each other.

In the flow field applying step, by applying shear flow fields in directions substantially perpendicular to the thickness direction of the polymer solution 70 (directions substantially parallel to the principal surfaces 40a and 50a) and shear flow fields in the thickness direction of the polymer solution 70 to the polymer solution 70, micro domains having wave-like shapes having amplitudes in the thickness direction of the polymer solution 70 are formed in the polymer solution 70.

The flow fields applied to the outer layer portions of the polymer solution 70 propagate in the thickness direction of the polymer solution 70 from the outer layer portions to the center portion of the polymer solution 70. In this case, depending on the magnitudes of the flow fields applied to the outer layer portions, the magnitudes of the flow fields propagating in the thickness direction of the polymer solution 70 attenuate with increasing distance from the outer layer portions of the polymer solution 70. In this case, the magnitude of the flow field applied to the outer layer portion of the polymer solution 70 and the magnitude of the flow field applied to the center portion of the polymer solution 70 are different from each other. Therefore, by adjusting the application directions and the magnitudes of the shear flow fields, the shapes of the micro domains can be adjusted so as to differ between the outer layer portions and the center portion of the polymer solution 70.

In the flow field applying step, by adjusting the application directions and the magnitudes of the shear flow fields, a front surface layer 110 and a back surface layer 120 in which maximum values of distances in the thickness direction of the polymer solution 70 between the tops of convexities and the bottoms of concavities of the micro domains are larger than the wavelength in the visible light range are formed in respective regions on the plate-shaped member 40 side and the plate-shaped member 50 side (regions of the outer layer portions) in the polymer solution 70, and an intermediate layer 130 in which distances in the thickness direction of the polymer solution 70 between the tops of convexities and the bottoms of concavities of micro domains are equal to or less than the wavelength in the visible light range is formed in a region between the front surface layer 110 and the back surface layer 120 (region at the center portion) in the polymer solution 70.

The method for obtaining the resin molded body 100 by applying shear flow fields to the polymer solution 70 is not limited to the above-described method, and the methods shown in FIG. 6 and FIG. 7 can also be used. FIG. 6 illustrates a method in which steady motion of the plate-shaped member 50 within a plane substantially parallel to the principal surface 50a is caused. Here, "steady motion" is a motion made by repeating a predetermined motion at a fixed speed, and is, for example, a turning motion or planetary motion. FIG. 7 illustrates a method in which oscillatory motion of the plate-shaped member 50 within a plane substantially parallel to the principal surface 50a is caused. In FIG. 6 and FIG. 7, for the sake of convenience, members other than the plate-shaped member 50 are not illustrated. The reference numeral 80 in FIG. 6 is described for clearly showing whether the rotative motion of the plate-shaped member 50 is caused, and is not indicated in actuality.

As a method for obtaining the resin molded body 100 by applying shear flow fields to the polymer solution 70, the following methods (a) to (d) can be used.

(a) "Turning motion": A method in which the plate-shaped member 50 is caused to turn around the reference axis A that does not pass through the center point P2 of the principal surface 50b and is substantially perpendicular to the principal surface 50b (FIG. 5 and FIG. 6(a)).

(b) "Planetary motion": A method in which the plate-shaped member 50 is caused to turn around the reference axis A while the plate-shaped member 50 is caused to rotate on an axis passing through the center point P2 of the principal surface 50b (FIG. 6(b)).

(c) "Oscillatory motion (reciprocating motion) in a plurality of directions without rotative motion (spinning)": A method in which the plate-shaped member 50 is caused to oscillate in one direction, and then caused to oscillate in another direction (FIG. 7(a)).

(d) "Oscillatory motion with rotative motion (spinning)": A method in which the plate-shaped member 50 is caused to oscillate in at least a uniaxial direction while the plate-shaped member 50 is caused to rotate on an axis passing through the center point P2 of the principal surface 50b (FIG. 7(b)).

In the flow field applying step, shear flow fields may be simultaneously applied in the plurality of directions to the polymer solution, or shear flow fields may be applied in a plurality of directions in multiple stages to the polymer solution. As the method for simultaneously applying shear flow fields in a plurality of directions, the above-described method (a), (b) or (d) can be used. As the method for applying shear flow fields in a plurality of directions in multiple stages, the above-described method (c) can be used. The two-dimensional alignment of concavities and convexities is easily obtained by the above-described methods (a) and (b), and the one-dimensional alignment of concavities and convexities is easily obtained by the above-described methods (c) and (d).

In the flow field applying step, it is preferable that flow fields are applied from the respective plate-shaped members 40 and 50 to the polymer solution 70 in directions opposite to each other by moving the plate-shaped members 40 and 50 so that the motion directions of these become opposite to each other. The motion methods and motion conditions of the plate-shaped members 40 and 50 are preferably substantially the same as each other except for the motion directions because the magnitudes of the shear flow fields applied from the respective plate-shaped members 40 and 50 to the polymer solution 70 become substantially the same as each other and the shapes of micro domains can be easily adjusted.

In FIG. 6(a) and FIG. 6(b), a reference point is selected in the principal surface 50b and the plate-shaped member 50 is turned around a reference axis that passes through the reference point and is substantially perpendicular to the principal surface 50b, however, the plate-shaped member 50 may be turned around a reference axis positioned outside the plate-shaped member 50. In FIG. 6(b), the rotating direction of the rotative motion and the turning direction of the turning motion are preferably opposite to each other.

In FIG. 7(a) and FIG. 7(b), the plate-shaped member 40 and the plate-shaped member 50 are preferably oscillated in simple harmonic motions at frequencies the same as each other in directions opposite to each other. In FIG. 7(b), the plate-shaped member 40 and the plate-shaped member 50 are preferably rotated at rotating speeds the same as each other in directions opposite to each other, and for example, the plate-shaped member 40 is rotated on an axis that passes through the center point P1 of the principal surface 40b in one direction, and the plate-shaped member 50 is rotated on an axis passing through the center point P2 of the principal surface 50b in a direction opposite to the rotating direction of the plate-shaped member 40.

The magnitudes of the shear flow fields to be applied to the polymer solution 70 can be appropriately adjusted by the motion speeds and the motion times of the plate-shaped members 40 and 50. In the first embodiment, the motion methods and motion conditions of the plate-shaped members 40 and 50 are appropriately selected according to the thickness of the polymer solution 70, and in the case where the thickness of the polymer solution 70 is more than 1000 μm and not more than 3000 μm, the motion methods and motion conditions are preferably adjusted as follows. The number of rotations in the turning motion is preferably 300 rpm or more and less than 350 rpm. The frequency in the oscillatory motion is preferably 25 $s^{-1}$ or more and less than 30 $s^{-1}$. The number of rotations in the rotative motion is preferably 170 rpm or more and less than 200 rpm. The temperature of the polymer solution 70 is preferably 20 to 30° C., and the flow field application time is preferably 5 to 10 minutes.

In the annealing step, by annealing the polymer solution having the micro-phase separated structure, the regularity of the micro-phase separated structure is improved. The annealing temperature is preferably 15 to 100° C.

In the photopolymerizing step, the photopolymerizable monomer in the polymer solution is polymerized by irradiating the polymer solution with activated light (for example, ultraviolet ray). Accordingly, the micro-phase separated structure can be fixed by a simple method while the micro-phase separated structure formed in the flow field applying step is held. Through the above-described steps, the resin molded body 100 can be obtained.

Second Embodiment

Resin Molded Body

Figure 8:
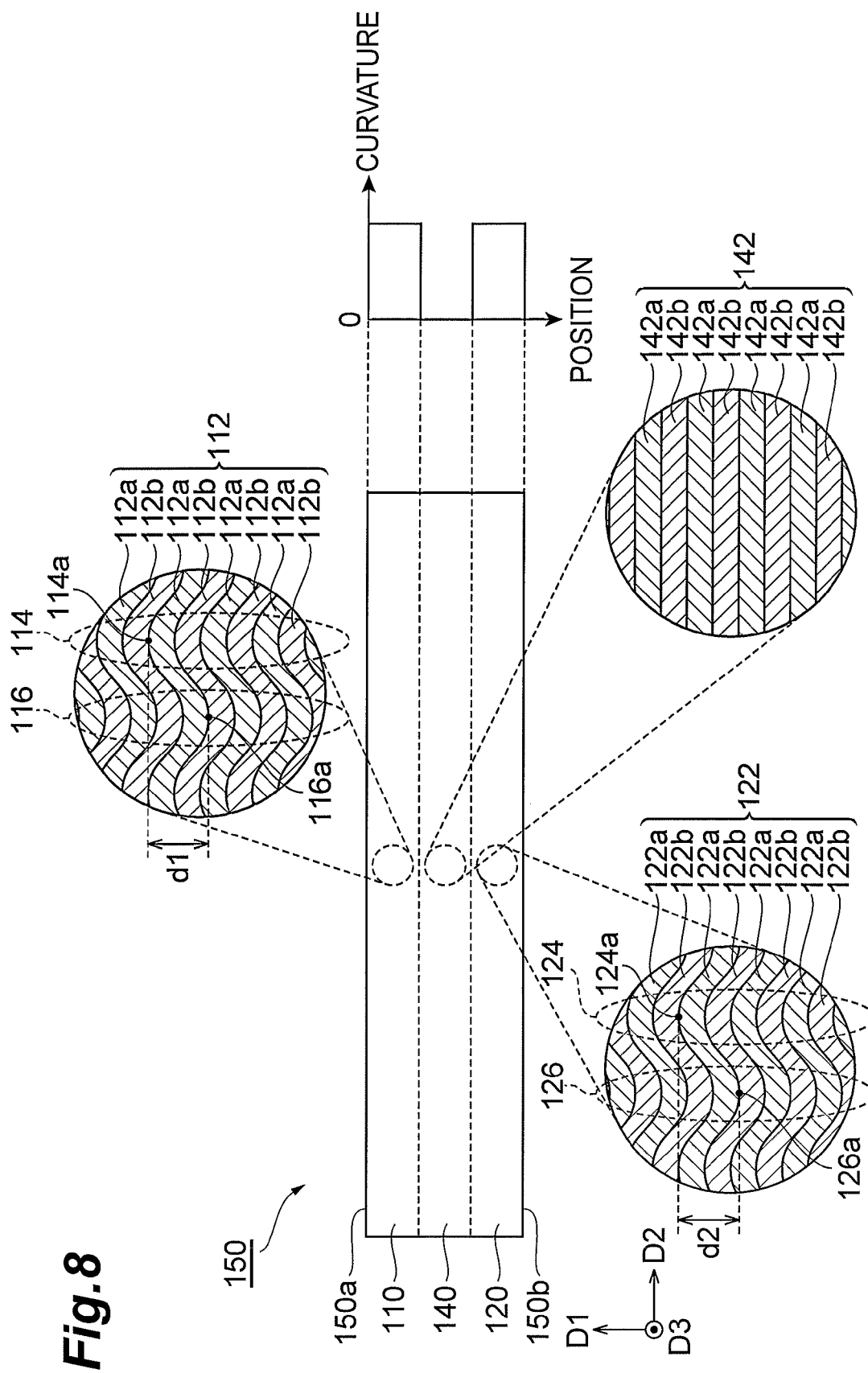
FIG. 8 is a schematic sectional view showing a resin molded body according to another embodiment of the present invention.

FIG. 8 is a schematic sectional view showing a resin molded body according to a second embodiment. A resin molded body (structural color body) 150 according to the second embodiment has the same configuration as that of the resin molded body 100 according to the first embodiment except that the resin molded body 150 comprises an intermediate layer (third resin layer) 140 instead of the intermediate layer 130.

The resin molded body 150 is, for example, cylindrical, and has a front surface (first principal surface) 150a and a back surface (second principal surface) 150b opposed substantially parallel to each other. The thickness of the resin molded body 150 in the opposite direction D1 of the front surface 150a and the back surface 150b is preferably more than 1000 μm and not more than 3000 μm.

The intermediate layer 140 is in contact with the front surface layer 110 and the back surface layer 120 between the front surface layer 110 and the back surface layer 120. The thickness of the intermediate layer 140 is preferably 400 to 1000 μm. The intermediate layer 140 is made by a polymer photonic crystal containing the same constituents as those in the first embodiment, and has a micro-phase separated structure.

The micro-phase separated structure of the intermediate layer 140 includes lamellar micro domains 142 consisting of micro domains 142a and micro domains 142b, and is a refractive index periodic structure formed by alternately laminating the micro domains 142a and the micro domains 142b. The micro domains 142a contain one polymer chain of the block copolymer as a major constituent, and the micro domains 142b contain the other polymer chain of the block copolymer as a major constituent. Each micro domain 142 of the intermediate layer 140 has a tabular shape oriented substantially parallel to at least one of the front surface 150a or the back surface 150b.

(Method for Manufacturing Resin Molded Body)

In a method for manufacturing the resin molded body 150 according to the second embodiment, the flow field applying step is different from that in the first embodiment, and other steps (the solution preparing step, the annealing step, and the photopolymerizing step, etc.) are the same as those in the first embodiment.

The magnitudes of the shear flow fields to be applied in the flow field applying step of the second embodiment is different from those of the first embodiment. In the second embodiment, by setting the magnitudes of the shear flow fields in the thickness direction of the polymer solution 70 to be smaller than those in the first embodiment, the magnitudes of the flow fields to be applied in the thickness direction of the polymer solution 70 to the center portion of the polymer solution 70 easily become small. Accordingly, in the region between the front surface layer 110 and the back surface layer 120 (region at the center portion) of the polymer solution 70, the intermediate layer 140 including tabular micro domains oriented substantially parallel to at least one of the principal surface 40a of the plate-shaped member 40 or the principal surface 50a of the plate-shaped member 50 can be formed.

In the second embodiment, the motion methods and motion conditions of the plate-shaped members 40 and 50 are appropriately selected according to the thickness of the polymer solution 70, and when the thickness of the polymer solution 70 is more than 1000 μm and not more than 3000 μm, the motion methods and motion conditions are preferably adjusted as follows. The number of rotations in the turning motion is preferably 200 rpm or more and less than 300 rpm. The frequency in the oscillatory motion is preferably 20 $s^{-1}$ or more and less than 25 $s^{-1}$. The number of rotations in the rotative motion is preferably 150 rpm or more and less than 170 rpm. The temperature of the polymer solution 70 is preferably 20 to 30° C., and the flow field application time is preferably 5 to 10 minutes.

Figure 9:
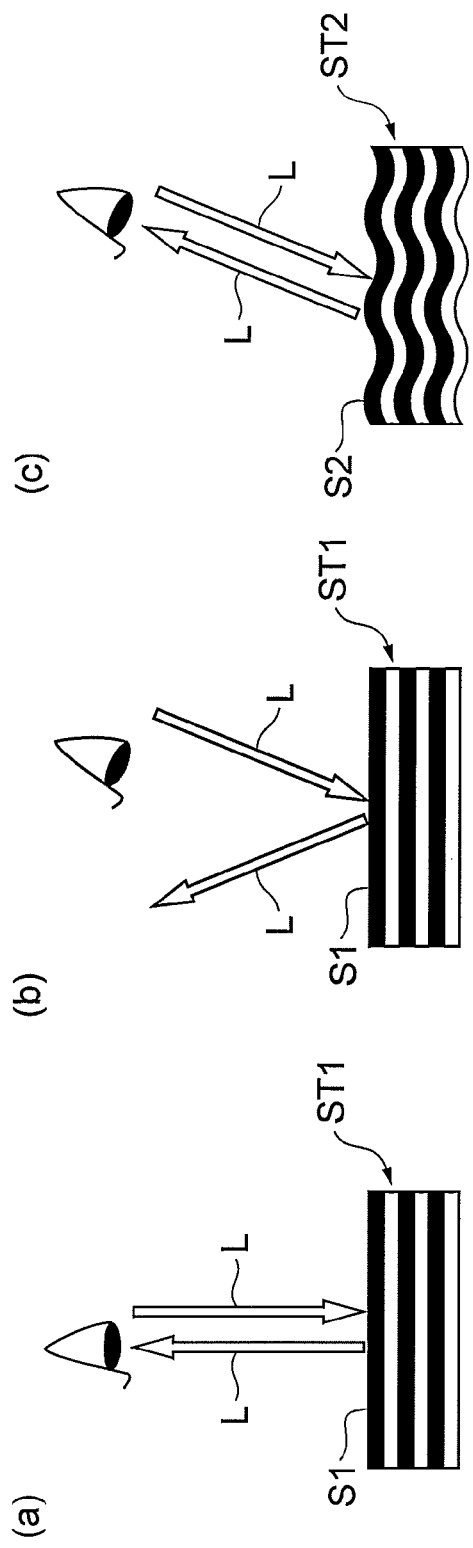
FIG. 9 is a view for describing visibilities of structural colors.

FIG. 9 is a view for describing the visibilities of structural colors, and is a view for describing the visibilities of structural colors when light is irradiated on a structural color body including lamellar micro domains. In FIG. 9(a) and FIG. 9(b), each of the micro domains of the structural color body ST1 has a tabular shape oriented parallel to the principal surface of the structural color body ST1. In FIG. 9(c), each of the micro domains of the structural color body ST2 has a wave-like shape having large amplitudes in the thickness direction of the structural color body ST2 (for example, each of the micro domains has a wave-like shape whose maximum value of distances in the thickness direction of the structural color body ST2 between the tops of convexities and the bottoms of concavities is larger than the wavelength in the visible light range).

In FIG. 9(a), light L irradiated onto the principal surface S1 from the thickness direction of the structural color body ST1 is reflected in a direction opposite to the incident direction of the light L at the micro domains of the structural color body ST1. In FIG. 9(a), the principal surface S1 is observed from the thickness direction of the structural color body ST1, and the light L reflected at the micro domains of the structural color body ST1 is observed.

In FIG. 9(b), light L irradiated onto the principal surface S1 from a direction crossing the thickness direction of the structural color body ST1 is reflected in another direction crossing the thickness direction of the structural color body ST1 at the micro domains of the structural color body ST1. In FIG. 9(b), the principal surface S1 is observed from the incident direction of the light L, and light L reflected at the micro domains of the structural color body ST1 is not observed.

In FIG. 9(c), light L irradiated onto the principal surface S2 from a direction crossing the thickness direction of the structural color body ST2 is reflected in a direction opposite to the incident direction of the light L at the wave-like micro domains of the structural color body ST2. In FIG. 9(c), the principal surface S2 is observed from the incident direction of the light L, and light L reflected at the micro domains of the structural color body ST2 is observed.

Specifically, when a structural color body includes wave-like micro domains having large amplitudes, even when light in the visible light range is made incident on the principal surface of the structural color body from a direction inclined with respect to the thickness direction of the structural color body, a structural color can be observed, so that an angle range in which structural colors are observable is sufficiently widened. On the other hand, when each of the micro domains has a tabular shape oriented parallel to the principal surface of the structural color body, or when the amplitudes of the wave-like micro domains are small (for example, distances in the thickness direction of the structural color body between the tops of convexities and the bottoms of concavities of the wave-like micro domains are equal to or less than the wavelength in the visible light range), light in the visible light range that is made incident from a direction inclined with respect to the thickness direction of the structural color body does not tend to be sufficiently reflected.

In the resin molded bodies 100 and 150, the respective micro domain 112 of the front surface layer 110 and the respective micro domain 122 of the back surface layer 120 have wave-like shapes having amplitudes in the direction D1, and in each of the micro domains 112, a maximum value of distances d1 in the direction D1 between the tops 114a of convexities 114 and the bottoms 116a of concavities 116 is larger than the wavelength in the visible light range, and in each of the micro domains 122, a maximum value of distances d2 in the direction D1 between the tops 124a of convexities 124 and the bottoms 126a of concavities 126 is larger than the wavelength in the visible light range. In this case, even when light in the visible light range is made incident on the principal surface of the resin molded body 100, 150 from a direction inclined with respect to the direction D1, a region perpendicular to an incident direction of light and a region inclined with respect to an incident direction of light to an extent to satisfy the Bragg reflection condition easily exist in the micro domain 112 of the front surface layer 110 and in the micro domain 122 of the back surface layer 120, so that light can be reflected at these regions. Therefore, in the resin molded bodies 100 and 150, even when light in the visible light range is made incident on the principal surface of the resin molded body 100, 150 from the direction inclined with respect to the direction D1, lights reflected at the front surface layer 110 and the back surface layer 120 can be observed as structural colors, so that an angle range in which structural colors are observable can be widened.

Further, in the resin molded body 100, each of the micro domains 132 of the intermediate layer 130 has a wave-like shape having amplitudes in the direction D1, and in each of the micro domains 132 of the intermediate layer 130, the distances d3 in the direction D1 between the tops 134a of convexities 134 and the bottoms 136a of concavities 136 of the micro domain 132 are equal to or less than the wavelength in the visible light range. In this case, a region perpendicular to an incident direction of light in the visible light range made incident from a direction inclined with respect to the direction D1 and a region inclined with respect to the incident direction of the light to an extent to satisfy the Bragg reflection condition hardly exist in the intermediate layer 130 as compared with the front surface layer 110 and the back surface layer 120. This intermediate layer 130 easily reflects the light in the visible light range made incident in the direction D1, however, it hardly reflects the light in the visible light range made incident from the direction inclined with respect to the direction D1 as compared with the front surface layer 110 and the back surface layer 120.

In the resin molded body 150, each of the micro domains 142 of the intermediate layer 140 is oriented substantially parallel to at least one of the front surface 150a or the back surface 150b. In this case, a region perpendicular to an incident direction of light in the visible light range made incident from a direction inclined with respect to the direction D1 and a region inclined with respect to the incident direction of the light to an extent to satisfy the Bragg reflection condition hardly exist in the intermediate layer 140 as compared with the front surface layer 110 and the back surface layer 120. This intermediate layer 140 easily reflects light in the visible light range made incident in the direction D1, however, it hardly reflects light in the visible light range made incident from the direction inclined with respect to the direction D1 as compared with the front surface layer 110 and the back surface layer 120.

In the resin molded bodies 100 and 150, when the principal surface of the resin molded body 100, 150 is observed from the direction D1, light reflected at the intermediate layer 130 or the intermediate layer 140 is easily observed as well as lights reflected at the front surface layer 110 and the back surface layer 120, and on the other hand, when the principal surface of the resin molded body 100, 150 is observed from the direction inclined with respect to the direction D1, the lights reflected at the front surface layer 110 and the back surface layer 120 are easily observed, however, the light reflected at the intermediate layer 130 or the intermediate layer 140 is hardly observed. Therefore, in the resin molded bodies 100 and 150, various structural colors depending on observation angles can be observed. In addition, in such a resin molded body, when either the first principal surface or the second principal surface is observed, an angle range in which structural colors are observable can be widened, and various structural colors depending on observation angles can be observed. In the resin molded bodies 100 and 150, when either the front surface 100a, 150a or the back surface 100b, 150b is observed, an angle range in which structural colors are observable can be widened, and various structural colors depending on observation angles can be observed.

Third Embodiment

Resin Molded Body

Figure 10:
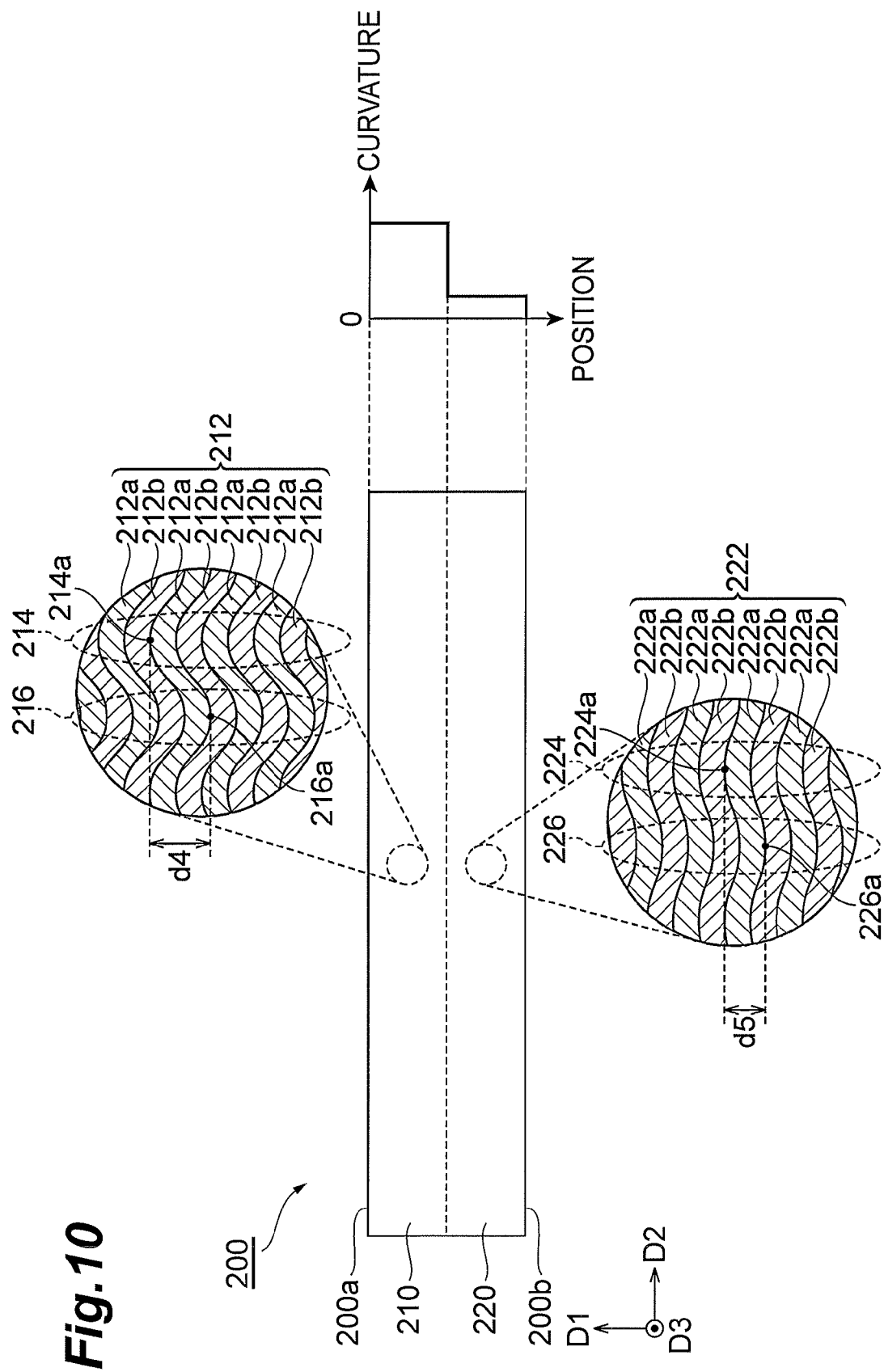
FIG. 10 is a schematic sectional view showing a resin molded body according to another embodiment of the present invention.

FIG. 10 is a schematic sectional view showing a resin molded body according to a third embodiment. The resin molded body (structural color body) 200 according to the third embodiment is, for example, cylindrical, and has a front surface (first principal surface) 200a and a back surface (second principal surface) 200b opposed substantially parallel to each other. The thickness of the resin molded body 200 is preferably more than 1000 μm and not more than 3000 μm.

The resin molded body 200 comprises a front surface layer (first resin layer) 210 disposed on the front surface 200a side and a back surface layer (second resin layer) 220 disposed on the back surface 200b side. The resin molded body 200 is formed by laminating the back surface layer 220 and the front surface layer 210 in this order. The back surface layer 220 is in contact with the front surface layer 210.

The thickness of the front surface layer 210 is preferably 300 to 1000 μm. The thickness of the back surface layer 220 is preferably 700 to 2000 mm.

The front surface layer 210 and the back surface layer 220 are made by polymer photonic crystals containing the same constituents as those in the first embodiment. Each of the front surface layer 210 and the back surface layer 220 has a micro-phase separated structure. The micro-phase separated structure of the front surface layer 210 includes lamellar micro domains 212 consisting of micro domains 212a and micro domains 212b, and is a refractive index periodic structure formed by alternately laminating the micro domains 212a and the micro domains 212b. The micro-phase separated structure of the back surface layer 220 includes lamellar micro domains 222 consisting of micro domains 222a and micro domains 222b, and is a refractive index periodic structure formed by alternately laminating the micro domains 222a and the micro domains 222b.

Each of the micro domains 212 of the front surface layer 210 has a wave-like shape (concavo-convex shape) having amplitudes in the opposite direction D1 of the front surface 200a and the back surface 200b. Each of the micro domains 212 includes convexities 214 convexed in the direction D1 and concavities 216 concaved in the direction D1 alternately along a direction substantially perpendicular to the direction D1. Similarly, each of the micro domains 222 of the back surface layer 220 has a wave-like shape (concavo-convex shape) having amplitudes in the direction D1. Each of the micro domains 222 includes convexities 224 convexed in the direction D1 and concavities 226 concaved in the direction D1 alternately along a direction substantially perpendicular to the direction D1.

The micro domains 212 and the micro domains 222 have two-dimensional or one-dimensional alignment of concavities and convexities. The wave axes of the respective micro domains are preferably substantially parallel to at least one of the front surface 200a or the back surface 200b. Each micro domain preferably has concavities and convexities isotropically curved in the direction D2 and the direction D3, and the persistence length of the concavities and convexities is preferably long in the direction D2 and the direction D3.

In each of the micro domains of the front surface layer 210 and the back surface layer 220, the distances in the direction D1 between the tops of convexities and the bottoms of concavities of the micro domain are adjusted based on the same wavelength λ1 as in the first embodiment. In detail, in each of the micro domains 212 of the front surface layer 210, a maximum value of the distances d4 in the direction D1 between the tops (for example, apexes) 214a of convexities 214 and the bottoms (for example, bottom points) 216a of concavities 216 of the micro domain 212 is larger than the wavelength λ1.

On the other hand, in each of the micro domains 222 of the back surface layer 220, the distances d5 in the direction D1 between the tops (for example, apexes) 224a of convexities 224 and the bottoms (for example, bottom points) 226a of concavities 226 of the micro domain 222 are either equal to or less than the wavelength λ1. This micro domain 222 has an optically flat shape.

As a target wavelength of the structural color body, the wavelength λ1 is the wavelength in the visible light range (for example, 350 to 700 nm). For example, the maximum value of the distances d4 is larger than 350 nm, and the distances d5 are equal to or less than 350 nm. The wavelength λ1 is more preferably the wavelength λ2.

(Method for Manufacturing Resin Molded Body)

In a method for manufacturing the resin molded body 200 according to the third embodiment, the flow field applying step is different from that in the first embodiment, and other steps (the solution preparing step, the annealing step, and the photopolymerizing step, etc.) are the same as those in the first embodiment.

A method for manufacturing the resin molded body 200 according to the third embodiment comprises, for example, a flow field applying step (first step) in which shear flow fields are applied to a solution containing a block copolymer, a photopolymerization initiator and a photopolymerizable monomer capable of dissolving the block copolymer and the photopolymerization initiator by moving a first member or a second member relative to the solution in directions different from each other substantially parallel to at least one of the principal surface of the first member or the principal surface of the second member opposing each other in a state where the solution is interposed between the principal surface of the first member and the principal surface of the second member, and a photopolymerizing step (second step) in which a resin molded body (structural color body) having a micro-phase separated structure including lamellar micro domains is obtained by polymerizing the photopolymerizable monomer by irradiating the solution with light after the flow field applying step.

Next, the flow field applying step is described with reference to FIG. 11. In the flow field applying step, first, as in the first embodiment, a plate-shaped member (first member) 40 having flat principal surfaces 40a and 40b opposed substantially parallel to each other and a plate-shaped member (second member) 50 having flat principal surfaces 50a and 50b opposed substantially parallel to each other are prepared, and then, an annular (ring-shaped) spacer 60 having a circular opening 60a is disposed on the principal surface 40a of the plate-shaped member 40. Next, after a polymer solution 70 is developed inside the opening 60a, by disposing the plate-shaped member 50 on the polymer solution 70 so that the center point P1 of the principal surface 40b and the center point P2 of the principal surface 50b do not oppose each other in the thickness direction of the polymer solution 70, and the principal surface 40a and the principal surface 50a oppose substantially parallel to each other, the polymer solution 70 is interposed between the principal surface 40a and the principal surface 50a. Subsequently, in the state where the polymer solution 70 is interposed between the principal surface 40a and the principal surface 50a, shear flow fields are applied to the polymer solution 70. In detail, by moving the plate-shaped member 40 or the plate-shaped member 50 relative to the polymer solution 70 in a plurality of directions substantially parallel to at least one of the principal surface 40a or the principal surface 50a, shear flow fields are applied to the polymer solution 70. For example, as shown in FIG. 5, around a reference axis A that passes through the center point P1 of the principal surface 40b and is substantially perpendicular to the principal surfaces 40b and 50b, the plate-shaped member 50 is turned (revolved) in a direction R1 substantially parallel to the principal surfaces 40a and 50a while the plate-shaped member 40 is fixed. Alternatively, the plate-shaped member 40 may be turned (revolved) while the plate-shaped member 50 is fixed.

The flow field applied to the front surface (surface on the plate-shaped member 50 side) of the polymer solution 70 propagates in the thickness direction of the polymer solution 70 from the front surface to the back surface (surface on the plate-shaped member 40 side) of the polymer solution 70. In this case, depending on the magnitude of the flow field applied to the front surface of the polymer solution 70, the magnitude of the flow field propagating in the thickness direction of the polymer solution 70 attenuates with increasing distance from the front surface of the polymer solution 70. In this case, the magnitude of the flow field applied to the region on the front surface side of the polymer solution 70 and the magnitude of the flow field applied to the region on the back surface side of the polymer solution 70 are different from each other. Therefore, by adjusting the application directions and the magnitudes of the shear flow fields, the shapes of the micro domains can be adjusted so as to differ between the region on the front surface side and the region on the back surface side of the polymer solution 70.

In the flow field applying step, by adjusting the application directions and the magnitudes of the shear flow fields, a front surface layer 210 in which a maximum value of distances in the thickness direction of the polymer solution 70 between the tops of convexities and the bottoms of concavities of micro domains is larger than the wavelength in the visible light range is formed in the region on the front surface side of the polymer solution 70, and a back surface layer 220 in which distances in the thickness direction of the polymer solution 70 between the tops of convexities and the bottoms of concavities of micro domains are equal to or less than the wavelength in the visible light range is formed in the region on the back surface side of the polymer solution 70.

The method for obtaining the resin molded body 200 by applying shear flow fields to the polymer solution 70 is not limited to the above-described method, and the methods shown in FIG. 6 and FIG. 7 can also be used. In the third embodiment, the motion method and motion conditions of the plate-shaped members 40 or 50 are appropriately selected according to the thickness of the polymer solution 70, and in the case where the thickness of the polymer solution 70 is more than 1000 µm and not more than 3000 µm, the motion methods and motion conditions are preferably adjusted as follows. The number of rotations in the turning motion is preferably 300 rpm or more and less than 350 rpm. The frequency in the oscillatory motion is preferably 25 $s^{-1}$ or more and less than 30 $s^{-1}$. The number of rotations in the rotative motion is preferably 170 rpm or more and less than 200 rpm. The temperature of the polymer solution 70 is preferably 20 to 30° C., and the flow field application time is preferably 5 to 10 minutes.

Fourth Embodiment

Resin Molded Body

Figure 12:
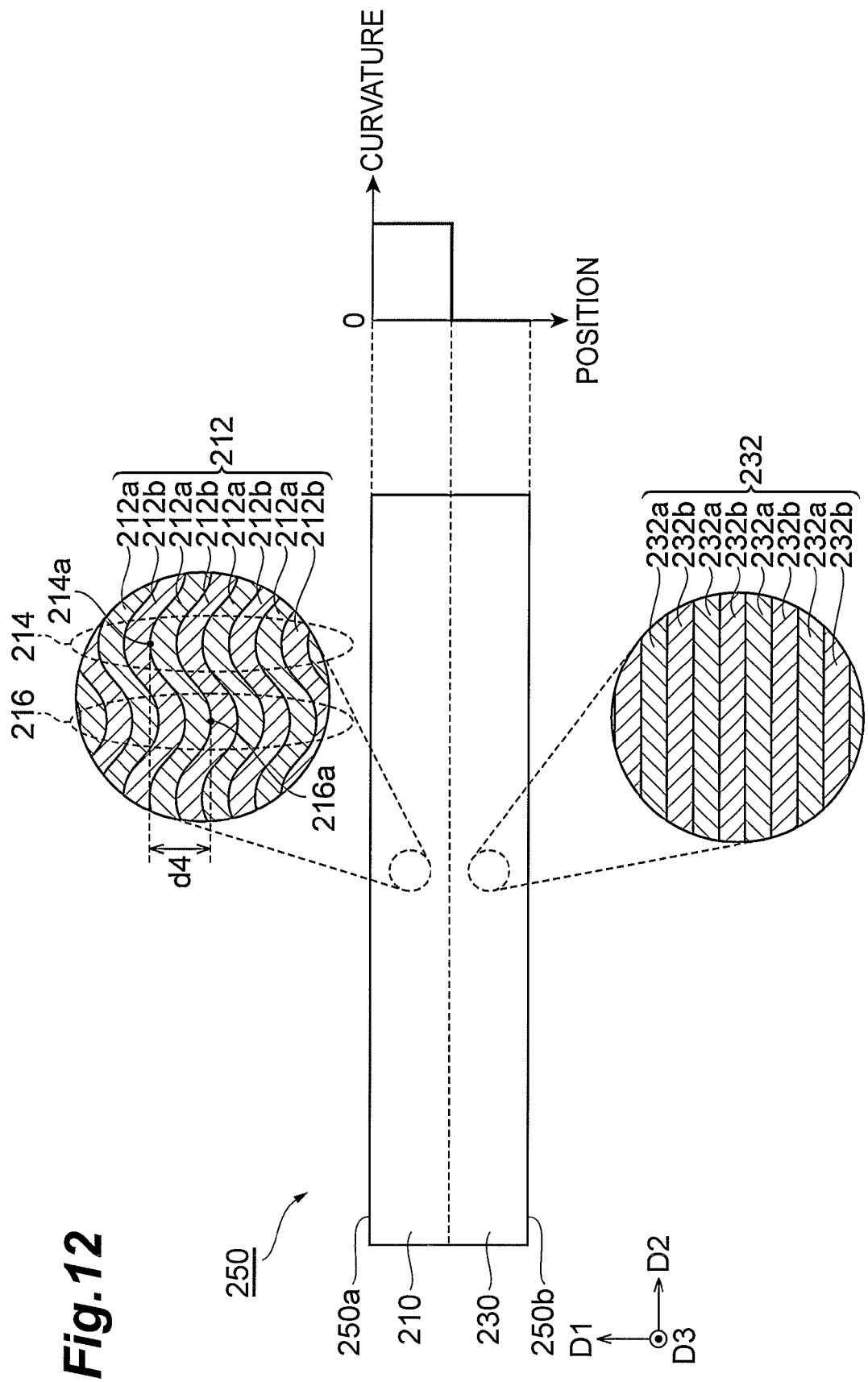
FIG. 12 is a schematic sectional view showing a resin molded body according to another embodiment of the present invention.

FIG. 12 is a schematic sectional view showing a resin molded body according to a fourth embodiment. A resin molded body (structural color body) 250 according to the fourth embodiment has the same configuration as that of the resin molded body 200 according to the third embodiment except that the resin molded body 250 comprises a back surface layer (second resin layer) 230 instead of the back surface layer 220.

The resin molded body 250 is, for example, cylindrical, and has a front surface (first principal surface) 250a and a back surface (second principal surface) 250b opposed substantially parallel to each other. The thickness of the resin molded body 250 in the opposite direction D1 of the front surface 250a and the back surface 250b is preferably more than 1000 µm and not more than 3000 µm.

The resin molded body 250 is formed by laminating the back surface layer 230 and the front surface layer 210 in this order. The back surface layer 230 is in contact with the front surface layer 210. The thickness of the back surface layer 230 is preferably 700 to 2000 µm. The back surface layer 230 is made by a polymer photonic crystal containing the same constituents as those in the first embodiment, and has a micro-phase separated structure.

The micro-phase separated structure of the back surface layer 230 includes lamellar micro domains 232 consisting of micro domains 232a and micro domains 232b, and is a refractive index periodic structure formed by alternately laminating the micro domains 232a and the micro domains 232b. The micro domains 232a contain one polymer chain of the block copolymer as a major constituent, and the micro domains 232b contain the other polymer chain of the block copolymer as a major constituent. Each micro domain 232 of the back surface layer 230 has a tabular shape oriented substantially parallel to at least one of the front surface 250a or the back surface 250b.

(Method for Manufacturing Resin Molded Body)

In a method for manufacturing the resin molded body 250 according to the fourth embodiment, the flow field applying step is different from that in the third embodiment, and other steps (the solution preparing step, the annealing step, and the photopolymerizing step, etc.) are the same as those in the first embodiment.

The magnitudes of the shear flow fields to be applied in the flow field applying step of the fourth embodiment are different from those of the third embodiment. In the fourth embodiment, by setting the magnitudes of the shear flow fields in the thickness direction of the polymer solution 70 to be smaller than those in the third embodiment, the magnitudes of the flow fields to be applied in the thickness direction of the polymer solution 70 to the region on the back surface side of the polymer solution 70 easily become small. Accordingly, in the region on the back surface side of the polymer solution 70, the back surface layer 230 including tabular micro domains oriented substantially parallel to at least one of the principal surface 40a of the plate-shaped member 40 or the principal surface 50a of the plate-shaped member 50 can be formed.

In the fourth embodiment, the motion methods and motion conditions of the plate-shaped member 40 or 50 are appropriately selected according to the thickness of the polymer solution 70, and when the thickness of the polymer solution 70 is more than 1000 µm and not more than 3000 µm, the motion methods and motion conditions are preferably adjusted as follows. The number of rotations in the turning motion is preferably 200 rpm or more and less than 300 rpm. The frequency in the oscillatory motion is preferably 20 $s^{-1}$ or more and less than 25 $s^{-1}$. The number of rotations in the rotative motion is preferably 150 rpm or more and less than 170 rpm. The temperature of the polymer solution 70 is preferably 20 to 30° C., and the flow field application time is preferably 5 to 10 minutes.

In the resin molded bodies 200 and 250, the respective micro domains 212 of the front surface layer 210 have wave-like shapes having amplitudes in the direction D1, and in each of the micro domains 212, a maximum value of distances d4 in the direction D1 between the tops 214a of convexities 214 and the bottoms 216a of concavities 216 is larger than the wavelength in the visible light range. In this case, even when light in the visible light range is made incident on the principal surface of the resin molded body 200, 250 from a direction inclined with respect to the direction D1, a region perpendicular to an incident direction of light and a region inclined with respect to an incident direction of light to an extent to satisfy the Bragg reflection condition easily exist in the micro domains 212 of the front surface layer 210, so that light can be reflected at these regions. Therefore, in the resin molded bodies 200 and 250, even when light in the visible light range is made incident on the principal surface of the resin molded body 200, 250 from the direction inclined with respect to the direction D1, light reflected at the front surface layer 210 can be observed as a structural color, so that an angle range in which structural colors are observable can be widened.

Further, in the resin molded body 200, each of the micro domains 222 of the back surface layer 220 has a wave-like shape having amplitudes in the direction D1, and in each of the micro domains 222 of the back surface 220, the distances d5 in the direction D1 between the tops 224a of convexities 224 and the bottoms 226a of concavities 226 of the micro domain 222 are equal to or less than the wavelength in the visible light range. In this case, a region perpendicular to an incident direction of light in the visible light range made incident from a direction inclined with respect to the direction D1 and a region inclined with respect to the incident direction of the light to an extent to satisfy the Bragg reflection condition hardly exist in the back surface layer 220 as compared with the front surface layer 210. This back surface 220 easily reflects the light in the visible light range made incident in the direction D1, however, it hardly reflects the light in the visible light range made incident from the direction inclined with respect to the direction D1 as compared with the front surface layer 210.

In the resin molded body 250, each of the micro domains 232 of the back surface layer 230 is oriented substantially parallel to at least one of the front surface 250a or the back surface 250b. In this case, a region perpendicular to an incident direction of light in the visible light range made incident from a direction inclined with respect to the direction D1 and a region inclined with respect to the incident direction of the light to an extent to satisfy the Bragg reflection condition hardly exist in the back surface layer 230 as compared with the front surface layer 210. This back surface layer 230 easily reflects light in the visible light range made incident in the direction D1, however, it hardly reflects light in the visible light range made incident from the direction inclined with respect to the direction D1 as compared with the front surface layer 210.

In the resin molded bodies 200 and 250, when the principal surface of the resin molded body 200, 250 is observed from the direction D1, light reflected at the back surface layer 220 or the back surface layer 230 is easily observed as well as light reflected at the front surface layer 210, and on the other hand, when the principal surface of the resin molded body 200, 250 is observed from the direction inclined with respect to the direction D1, the light reflected at the front surface layer 210 is easily observed, however, the light reflected at the back surface layer 220 or the back surface layer 230 is hardly observed. Therefore, in the resin molded bodies 200 and 250, various structural colors depending on observation angles can be observed. In addition, in the resin molded bodies 200 and 250, when either the front surface 200a, 250a or the back surface 200b, 250b is observed, an angle range in which structural colors are observable can be widened, and various structural colors depending on observation angles can be observed.

Fifth Embodiment

Resin Molded Body

Figure 13:
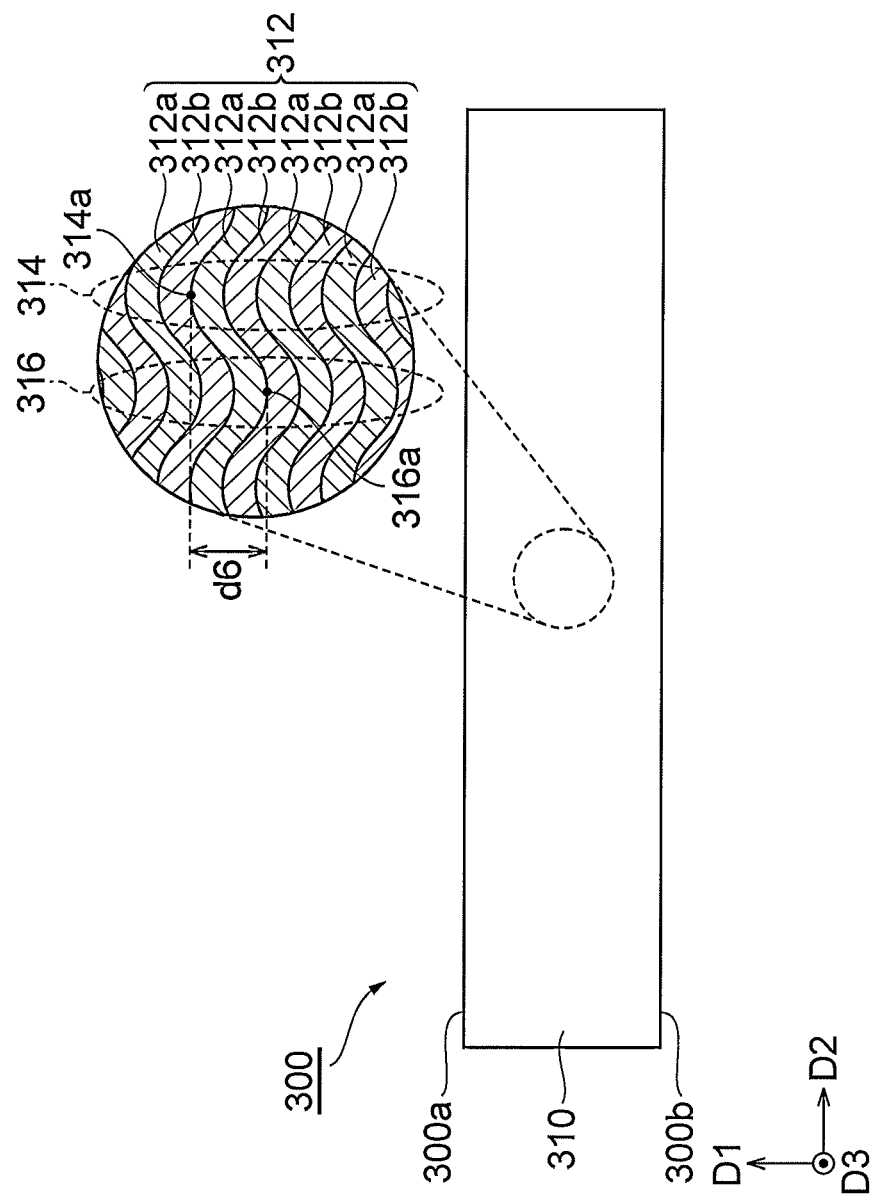
FIG. 13 is a schematic sectional view showing a resin molded body according to another embodiment of the present invention.

FIG. 13 is a schematic sectional view showing a resin molded body according to a fifth embodiment. The resin molded body (structural color body) 300 according to the fifth embodiment is, for example, cylindrical, and has a front surface (first principal surface) 300a and a back surface (second principal surface) 300b opposed substantially parallel to each other. The resin molded body 300 is entirely composed of a resin layer 310, and the thickness of the resin molded body 300 (the thickness of the resin layer 310) is preferably more than 1000 μm and not more than 3000 μm.

The resin layer 310 is made by a polymer photonic crystal containing the same constituents as those in the first embodiment. The resin layer 310 has a micro-phase separated structure. The micro-phase separated structure of the resin layer 310 includes lamellar micro domains 312 consisting of micro domains 312a and micro domains 312b, and is a refractive index periodic structure formed by alternately laminating the micro domains 312a and the micro domains 312b.

Each of the micro domains 312 of the resin layer 310 has a wave-like shape (concavo-convex shape) having amplitudes in the opposite direction D1 of the front surface 300a and the back surface 300b. Each of the micro domains 312 has convexities 314 convexed in the direction D1 and concavities 316 concaved in the direction D1 alternately along a direction substantially perpendicular to the direction D1.

The micro domains 312 have two-dimensional or one-dimensional alignment of concavities and convexities similar to the first embodiment. The wave axes of the respective micro domains are preferably substantially parallel to at least one of the front surface 300a or the back surface 300b. Each micro domain preferably has concavities and convexities isotropically curved in the direction D2 and the direction D3, and the persistence length of concavities and convexities is preferably long in the direction D2 and the direction D3.

In each of the micro domains of the resin layer 310, the distances d5 in the direction D1 between the tops of convexities and the bottoms of concavities of the micro domain are adjusted based on the same wavelength $\lambda 1$ as in the first embodiment. In detail, in each of the micro domains 312 of the resin layer 310, a maximum value of the distances d6 in the direction D1 between the tops (for example, apexes) 314a of convexities 314 and the bottoms (for example, bottom points) 316a of concavities 316 of the micro domain 312 is larger than the wavelength $\lambda 1$. As a target wavelength of the structural color body, the wavelength $\lambda 1$ is the wavelength in the visible light range (for example, 350 to 700 nm). For example, the maximum value of the distances d6 is larger than 350 nm. The wavelength $\lambda 1$ is preferably the above-described wavelength $\lambda 2$.

(Method for Manufacturing Resin Molded Body)

In a method for manufacturing the resin molded body 300 according to the fifth embodiment, the flow field applying step is different from that in the third embodiment, and other steps (the solution preparing step, the annealing step, and the photopolymerizing step, etc.) are the same as those in the first embodiment.

In the flow field applying step in the fifth embodiment, the magnitudes of the shear flow fields are different from those in the first embodiment. In the fifth embodiment, by setting the magnitudes of the shear flow fields in the thickness direction of the polymer solution 70 to be larger than those in the first embodiment, adjustment is performed so that predetermined or more flow fields are applied to the entire polymer solution 70. Specifically, in the flow field applying step, by adjusting the application directions and magnitudes of shear flow fields, the resin layer 310 whose maximum value of distances in the thickness direction of the polymer solution 70 between the tops of convexities and the bottoms of concavities of micro domains is larger than the wavelength in the visible light range is formed in the entire polymer solution 70.

In the fifth embodiment, the motion methods and motion conditions of the plate-shaped members 40 and 50 are appropriately selected according to the thickness of the polymer solution 70, and when the thickness of the polymer solution 70 is more than 1000 μm and not more than 3000 μm, the motion methods and motion conditions are preferably adjusted as follows. The number of rotations in the turning motion is preferably 350 to 400 rpm. The frequency in the oscillatory motion is preferably 30 to 35 $s^{-1}$. The number of rotations in the rotative motion is preferably 200 to 250 rpm. The temperature of the polymer solution 70 is preferably 20 to 30° C., and the flow field application time is preferably 5 to 10 minutes.

In the resin molded body 300, each of the micro domains 312 have wave-like shapes having amplitudes in the direction D1, and in each of the micro domains 312, a maximum value of distances d6 in the direction D1 between the tops 314a of convexities 314 and the bottoms 316a of concavities 316 is larger than the wavelength in the visible light range. In this case, even when light in the visible light range is made incident on the front surface 300a or the back surface 300b from a direction inclined with respect to the direction D1, a region perpendicular to the incident direction of light and a region inclined with respect to an incident direction of light to an extent to satisfy the Bragg reflection condition easily exist in the micro domains 312 of the resin layer 310, so that light can be reflected at these regions. Therefore, in the resin molded body 300, even when light in the visible light range is made incident on the front surface 300a or the back surface 300b from the direction inclined with respect to the direction D1, light reflected at the resin layer 310 can be observed as a structural color, so that an angle range in which structural colors are observable can be widened.

In addition, in the resin molded body 300, when the front surface 300a or the back surface 300b is observed from the direction D1 and when the front surface 300a or the back surface 300b is observed from the direction inclined with respect to the direction D1, a region perpendicular to the observation direction easily exists in the micro domains 312 of the resin layer 310, so that a structural color can be uniformly observed regardless of the observation angle.

The present invention is not limited to the above-described embodiments, and various modifications are possible. For example, the intermediate layer 140 in the resin molded body 150 is in contact with the front surface layer 110 and the back surface layer 120, however, an intermediate layer A (fourth resin layer) may be further disposed between the front surface layer 110 and the intermediate layer 140, and an intermediate layer B (fifth resin layer) may be further disposed between the back surface layer 120 and the intermediate layer 140. The intermediate layer A is in contact with the front surface layer 110 and the intermediate layer 140, and the intermediate layer B is in contact with the back surface layer 120 and the intermediate layer 140. The intermediate layers A and B are made by polymer photonic crystals containing the same constituents as those in the first embodiment, and have micro-phase separated structures. The micro-phase separated structures of the intermediate layers A and B include lamellar micro domains, and each of the micro domains has a wave-like shape (concavo-convex shape) having amplitudes in the direction D1. Similar to the intermediate layer 130, in each of the micro domains of the intermediate layers A and B, the distances in the direction D1 between the tops of convexities and the bottoms of concavities of the micro domain are either equal to or less than the wavelength 2a. These intermediate layers A and B can be obtained by adjusting the motion methods and motion conditions of the plate-shaped members 40 and 50 to adjust the magnitudes of the shear flow fields in the thickness direction of the polymer solution 70.

In addition, in the resin molded body 250, the back surface layer 230 is in contact with the front surface layer 210, however, an intermediate layer C (third resin layer) may be further disposed between the front surface layer 210 and the back surface layer 230. The intermediate layer C is in contact with the front surface layer 210 and the back surface 230. The intermediate layer C is made by a polymer photonic crystal containing the same constituents as those in the first embodiment, and has a micro-phase separated structure. The micro-phase separated structure of the intermediate layer C includes lamellar micro domains, and each of the micro domains has a wave-like shape (concavo-convex shape) having amplitudes in the direction D1. Similar to the back surface layer 220, in each of the micro domains of the intermediate layer C, the distances in the direction D1 between the tops of convexities and the bottoms of concavities of the micro domain are either equal to or less than the wavelength λ1. This intermediate layer C can be obtained by adjusting the motion methods and motion conditions of the plate-shaped members 40 and 50 to adjust the magnitudes of the shear flow fields in the thickness direction of the polymer solution 70.

Further, the shape of the resin molded body is not limited to the shape having principal surfaces opposed substantially parallel to each other as long as the shape has principal surfaces opposed to each other. The shape of the resin molded body is not limited to being cylindrical, and may be rectangular parallelepiped, cubic, oval, spherical, etc., or may be cup-shaped, disc-shaped, or tray-shaped. In addition, the plate-shaped members 40 and 50 and the opening 60a of the spacer 60 are not limited to being circular, and may be, for example, rectangular.

Further, in the above-described embodiments, two plate-shaped members 40 and 50 opposing each other are used, however, three or more plate-shaped members may be used to apply shear flow fields to the polymer solution 70. For example, it is possible that two plate-shaped members are disposed on the polymer solution, and these plate-shaped members are moved to apply shear flow fields to the polymer solution 70.

The methods for fabricating the resin molded bodies 100, 150, 200, 250, and 300 are not limited to the above-described methods, and it is also possible that shear flow fields are applied to a polymer solution filled in a molding die.

What is claimed is:

1. A resin molded body having a first principal surface and a second principal surface opposed to each other, wherein
the resin molded body comprises a first resin layer containing a block copolymer,
the first resin layer has a micro-phase separated structure including lamellar micro domains,
each of the micro domains of the first resin layer has a wave-like shape having amplitudes in an opposite direction of the first principal surface and the second principal surface, and
in each of the micro domains of the first resin layer, a maximum value of distances in the opposite direction between tops of convexities and bottoms of concavities of the micro domain is larger than a wavelength in a visible light range.

2. The resin molded body according to claim 1, wherein
the resin molded body further comprises a second resin layer and a third resin layer that contain a block copolymer,
the first resin layer is disposed on a side of the first principal surface,
the second resin layer is disposed on a side of the second principal surface and has a micro-phase separated structure including lamellar micro domains,
the third resin layer is disposed between the first resin layer and the second resin layer and has a micro-phase separated structure including lamellar micro domains,
each of the micro domains of the second resin layer and the third resin layer has a wave-like shape having amplitudes in the opposite direction,
in each of the micro domains of the second resin layer, a maximum value of distances in the opposite direction between tops of convexities and bottoms of concavities of the micro domain is larger than a wavelength in a visible light range, and
in each of the micro domains of the third resin layer, distances in the opposite direction between tops of convexities and bottoms of concavities of the micro domain are equal to or less than a wavelength in a visible light range.

3. The resin molded body according to claim 1, wherein
the resin molded body further comprises a second resin layer and a third resin layer that contain a block copolymer,
the first resin layer is disposed on a side of the first principal surface,
the second resin layer is disposed on a side of the second principal surface and has a micro-phase separated structure including lamellar micro domains,
the third resin layer is disposed between the first resin layer and the second resin layer and has a micro-phase separated structure including lamellar micro domains,
each of the micro domains of the second resin layer has a wave-like shape having amplitudes in the opposite direction,
in each of the micro domains of the second resin layer, a maximum value of distances in the opposite direction between tops of convexities and bottoms of concavities of the micro domain is larger than a wavelength in a visible light range, and
each of the micro domains of the third resin layer is oriented substantially parallel to at least one of the first principal surface or the second principal surface.

4. The resin molded body according to claim 1, wherein
the resin molded body further comprises a second resin layer containing a block copolymer,
the first resin layer is disposed on a side of the first principal surface,
the second resin layer is disposed on a side of the second principal surface and has a micro-phase separated structure including lamellar micro domains,
each of the micro domains of the second resin layer has a wave-like shape having amplitudes in the opposite direction, and
in each of the micro domains of the second resin layer, distances in the opposite direction between tops of convexities and bottoms of concavities of the micro domain are equal to or less than a wavelength in a visible light range.

5. The resin molded body according to claim 1, wherein
the resin molded body further comprises a second resin layer containing a block copolymer,
the first resin layer is disposed on a side of the first principal surface,
the second resin layer is disposed on a side of the second principal surface and has a micro-phase separated structure including lamellar micro domains, and
each of the micro domains of the second resin layer is oriented substantially parallel to at least one of the first principal surface or the second principal surface.

6. The resin molded body according to claim 1, wherein the resin molded body is composed of the first resin layer.

7. The resin molded body according to claim 1, wherein a thickness in the opposite direction of the resin molded body is more than 1000 μm and not more than 3000 μm.

8. The resin molded body according to claim 2, wherein a thickness in the opposite direction of the resin molded body is more than 1000 μm and not more than 3000 μm.

9. The resin molded body according to claim 3, wherein a thickness in the opposite direction of the resin molded body is more than 1000 μm and not more than 3000 μm.

10. The resin molded body according to claim 4, wherein a thickness in the opposite direction of the resin molded body is more than 1000 μm and not more than 3000 μm.

11. The resin molded body according to claim 5, wherein a thickness in the opposite direction of the resin molded body is more than 1000 μm and not more than 3000 μm.

12. The resin molded body according to claim 6, wherein a thickness in the opposite direction of the resin molded body is more than 1000 μm and not more than 3000 μm.

* * * * *